United States Patent
Hashimoto

(10) Patent No.: US 12,219,280 B2
(45) Date of Patent: Feb. 4, 2025

(54) ELECTRONIC DEVICE WITH SENSING CIRCUIT

(71) Applicant: Innolux Corporation, Miaoli County (TW)

(72) Inventor: Kazuyuki Hashimoto, Miaoli County (TW)

(73) Assignee: Innolux Corporation, Miaoli County (TW)

(*) Notice: Subject to any disclaimer, the term of this patent is extended or adjusted under 35 U.S.C. 154(b) by 80 days.

(21) Appl. No.: 17/983,337

(22) Filed: Nov. 8, 2022

(65) Prior Publication Data
US 2023/0217131 A1    Jul. 6, 2023

Related U.S. Application Data

(60) Provisional application No. 63/296,493, filed on Jan. 5, 2022.

(51) Int. Cl.
*H04N 25/75* (2023.01)
*H04N 5/32* (2023.01)

(52) U.S. Cl.
CPC ............... *H04N 25/75* (2023.01); *H04N 5/32* (2013.01)

(58) Field of Classification Search
CPC .......... H04N 25/75; H04N 5/32; H04N 25/69; G01R 35/005; G01R 31/2829; G09G 3/3225; G09G 3/3266
See application file for complete search history.

(56) References Cited

U.S. PATENT DOCUMENTS

| | | |
|---|---|---|
| 2,848,564 A | 8/1958 | Keonjian |
| 9,479,868 B2 | 10/2016 | Ilango et al. |
| 2004/0000632 A1 | 1/2004 | Apte |
| 2005/0258337 A1 | 11/2005 | Ozawa |
| 2007/0183490 A1 | 8/2007 | Andersen et al. |
| 2010/0315394 A1 | 12/2010 | Katoh et al. |
| 2013/0082936 A1 | 4/2013 | Islamkulov et al. |
| 2014/0247382 A1 | 9/2014 | Moldovan et al. |
| 2014/0263952 A1* | 9/2014 | Taghibakhsh ..... H01L 27/14609 250/214 DC |
| 2014/0266420 A1 | 9/2014 | Brown et al. |
| 2015/0001504 A1 | 1/2015 | Kim et al. |
| 2017/0373655 A1 | 12/2017 | Mengad et al. |
| 2018/0144689 A1 | 5/2018 | Hong et al. |

(Continued)

FOREIGN PATENT DOCUMENTS

| | | |
|---|---|---|
| CA | 2497465 | 8/2006 |
| KR | 20120052638 | 5/2012 |

(Continued)

OTHER PUBLICATIONS

"Search Report of Europe Counterpart Application", issued on Jun. 21, 2023, p. 1-p. 15.

(Continued)

*Primary Examiner* — Mekonnen D Dagnew
(74) *Attorney, Agent, or Firm* — JCIPRNET

(57) ABSTRACT

An electronic device is provided. The electronic device includes an electronic unit, a sensing circuit and a circuit. The sensing circuit is electrically connected to the electronic unit through a sensing node. The circuit is electrically connected to the sensing node. The circuit is configured to apply a voltage to the sensing node.

18 Claims, 14 Drawing Sheets

(56) References Cited

U.S. PATENT DOCUMENTS

| | | | |
|---|---|---|---|
| 2019/0035322 A1 | 1/2019 | Kim et al. | |
| 2019/0180684 A1 | 6/2019 | Chaji et al. | |
| 2020/0020726 A1* | 1/2020 | Anas | H04N 25/44 |
| 2020/0082762 A1 | 3/2020 | Takasugi | |
| 2020/0152130 A1 | 5/2020 | Hong et al. | |
| 2020/0236320 A1* | 7/2020 | Lalanne | H04N 25/771 |
| 2020/0382085 A1 | 12/2020 | Kajiyama et al. | |
| 2021/0210000 A1 | 7/2021 | Lee et al. | |

FOREIGN PATENT DOCUMENTS

| | | |
|---|---|---|
| KR | 20190080269 | 7/2019 |
| KR | 20200061655 | 6/2020 |
| KR | 20200074739 | 6/2020 |
| WO | 2006005033 | 1/2006 |

OTHER PUBLICATIONS

"Search Report of Europe Counterpart Application", issued on Oct. 18, 2023, p. 1-p. 19.

\* cited by examiner

ELECTRONIC DEVICE WITH SENSING CIRCUIT

CROSS-REFERENCE TO RELATED APPLICATION

This application claims the priority benefit of U.S. provisional application Ser. No. 63/296,493, filed on Jan. 5, 2022. The entirety of the above-mentioned patent application is hereby incorporated by reference herein and made a part of this specification.

BACKGROUND

Technical Field

The disclosure relates a device, particularly, the disclosure relates to an electronic device.

Description of Related Art

A varactor antenna, a fingerprint sensor and an X-ray flat panel detector (FPD) may be respectively consisted by an active matrix pixel array, and may respectively comprise a sensing circuit (e.g. a voltage sensing circuit). In general, the sensing circuit may be used to test and calibrate the active matrix pixel array described above. However, the sensing circuit also needs to be tested and calibrated by an external equipment. The conventional varactor antenna, the conventional fingerprint sensor and the conventional X-ray flat panel detector do not have the test and calibration function of the sensing circuit.

SUMMARY

The disclosure is directed to an electronic device capable of calibrating function of a sensing circuit.

The electronic device of an embodiment of the disclosure includes an electronic unit, a sensing circuit and a circuit. The sensing circuit is electrically connected to the electronic unit through a sensing node. The circuit is electrically connected to the sensing node. The circuit is configured to apply a voltage to the sensing node.

Based on the above, according to the electronic device of the disclosure, the electronic device can effectively calibrate the sensing circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
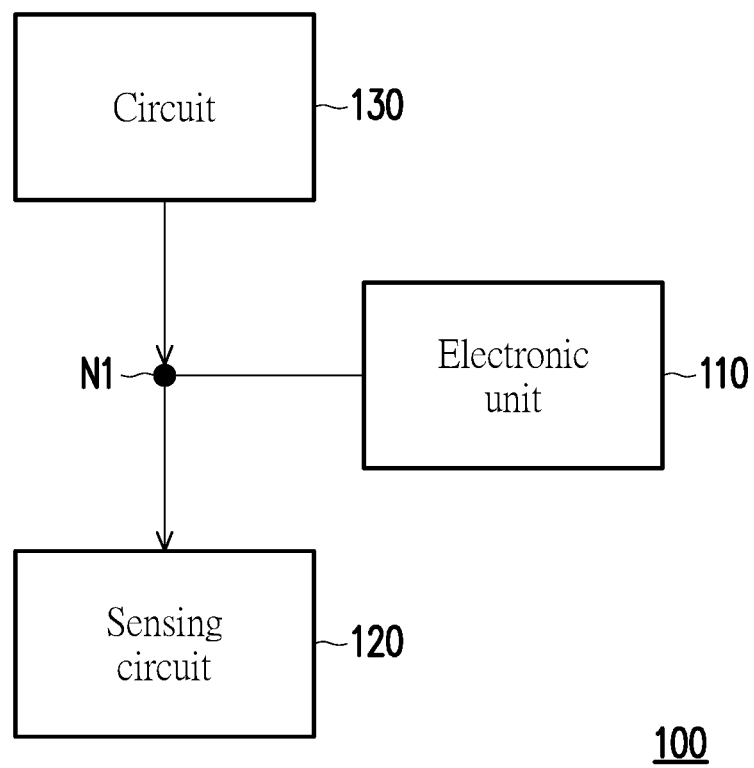
FIG. 1 is a schematic diagram of an electronic device according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

The term "electrically connection (or coupling)" used throughout the whole specification of the present application (including the appended claims) may refer to any direct or indirect connection means. For example, if the text describes that a first device is electrically connected (or coupled) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

An electronic device of the disclosure may be, for example, a varactor antenna, a fingerprint sensor or an X-ray flat panel detector (FPD). An electronic unit of the disclosure may be, for example, a voltage controlled unit or a sensing unit (e.g. a photodiode). It should be noted that, the electronic device of the disclosure may be manufactured using a display panel process, and related transistors and electronic components are fabricated on a glass substrate.

It should be noted that in the following embodiments, the technical features of several different embodiments may be replaced, recombined, and mixed without departing from the spirit of the disclosure to complete other embodiments. As long as the features of each embodiment do not violate the spirit of the disclosure or conflict with each other, they may be mixed and used together arbitrarily.

FIG. 1 is a schematic diagram of an electronic device according to an embodiment of the disclosure. Referring to FIG. 1, the electronic device 100 includes an electronic unit 110, a sensing circuit 120 and a circuit 130. The sensing circuit 120 is electrically connected to the electronic unit 110 through a sensing node N1. The circuit 130 is electrically connected to the sensing node N1, and configured to apply a specific voltage to the sensing node N1. In other embodiments of the disclosure, the circuit 130 may be a bias circuit or a reset circuit. In the embodiment of the disclosure, the electronic device 100 is configured to perform a calibration mode and a sensing mode. When the electronic device 100 performs the calibration mode, the sensing circuit 120 may sense the sensing node N1 with applying the specific voltage by the circuit. The electronic device 100 may generate a sense signal corresponding to a voltage of the sensing node N1. When the electronic device 100 performs the sensing mode, the sensing circuit 120 may sense the sensing node N1 after the specific voltage is applied to the sensing node N1.

Figure 2A:
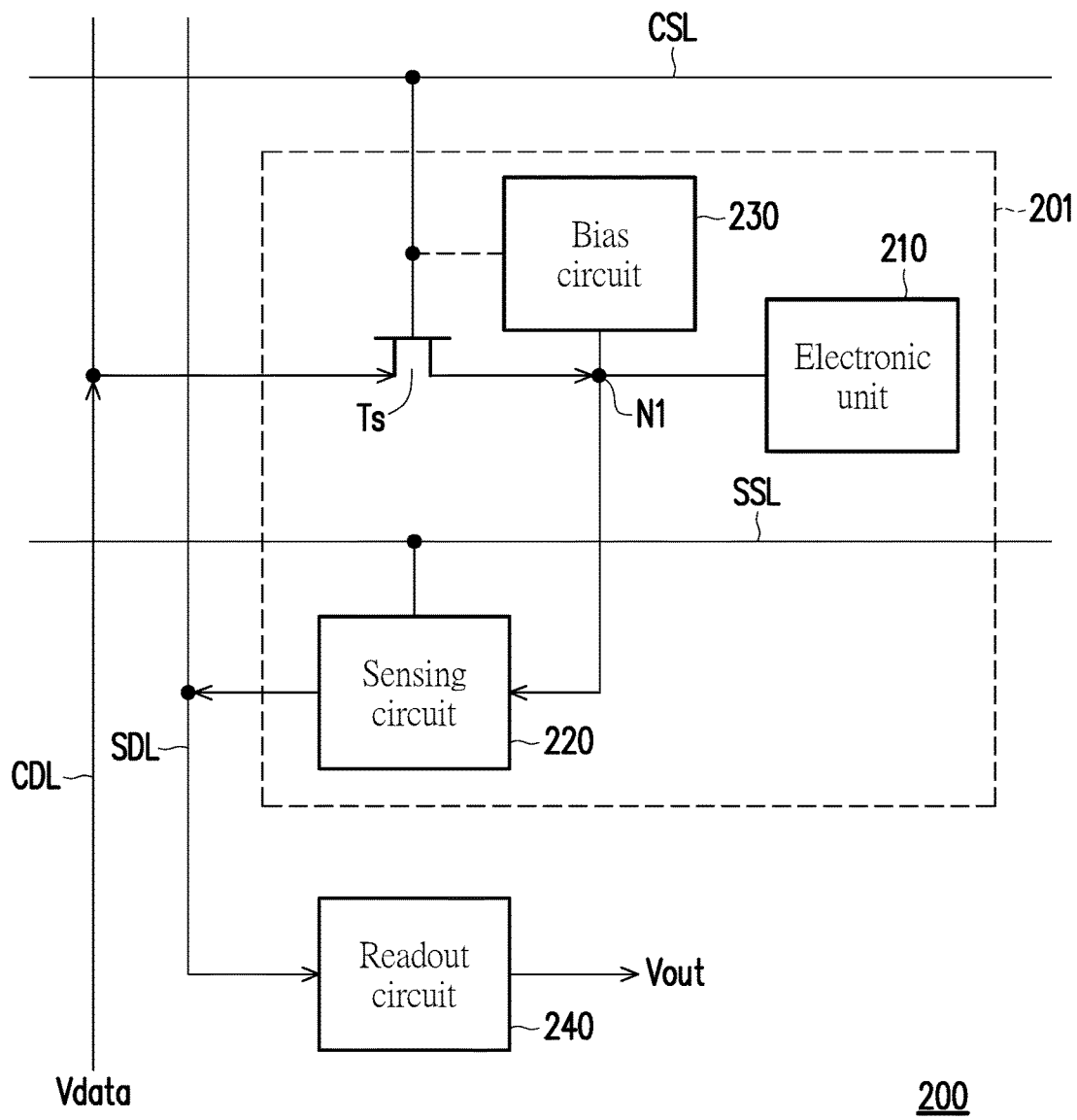
FIG. 2A is a schematic diagram of an electronic device according to an embodiment of the disclosure.
Figure 2B:
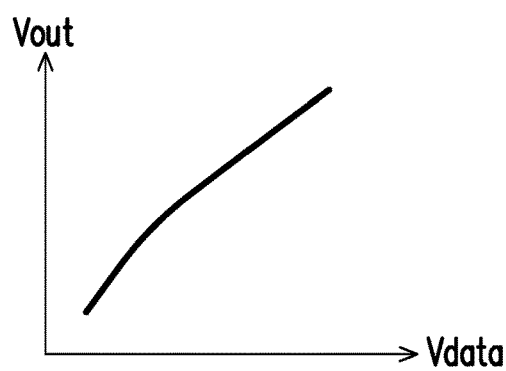
FIG. 2B is a schematic diagram of a relationship between an output voltage and a data voltage according to an embodiment of the disclosure.

FIG. 2A is a schematic diagram of an electronic device according to an embodiment of the disclosure. FIG. 2B is a schematic diagram of a relationship between an output voltage and a data voltage according to an embodiment of the disclosure. Referring to FIG. 2A and FIG. 2B, an electronic device 200 includes an active matrix pixel array including a plurality of pixels, and a circuit architecture of at least one of the pixels may be the same as a pixel 201 of FIG. 2A. The electronic device 200 may be an active matrix voltage controlled unit. In the embodiment of the disclosure, the electronic device 200 includes the pixel 201, a readout circuit 240, a control data line CDL, a sense data line SDL, a control scan line CSL and a sense scan line SSL. The control data line CDL and the sense data line SDL may be electrically connected to multiple pixels in one column of the active matrix pixel array, respectively. The control scan line CSL and the sense scan line SSL may be electrically connected to multiple pixels in one row of the active matrix pixel array, respectively. The pixel 201 includes a scan transistor Ts, an electronic unit 210, a bias circuit 230 (corresponding to the circuit 130 of FIG. 1) and a sensing circuit 220.

In the embodiment of the disclosure, the sensing circuit 220 is electrically connected to the electronic unit 210 through a sensing node N1. The bias circuit 230 is electrically connected to the sensing node N1. The sensing circuit 220 is electrically connected to the sense scan line SSL for receiving a sense scan signal, and is electrically connected to the sense data line SDL for providing a sense signal. The sense scan signal is used to control (enable) the sensing circuit 220. The bias circuit 230 and the scan transistor Ts is electrically connected to the control scan line CSL for receiving a scan signal, and is electrically connected to the control data line CDL for receiving a control signal with a data voltage Vdata. That is, the bias circuit 230 receives the control signal through the control data line CSL according to the scan signal. A control terminal of the scan transistor Ts is electrically connected to the control scan line CSL. A first terminal of the scan transistor Ts is electrically connected to the control data line CDL. That is, the scan transistor Ts is electrically connected between the control data line CDL and the bias circuit 230, and receives the scan signal. A second terminal of the scan transistor Ts is electrically connected to the sensing node N1. The readout circuit 240 is electrically connected to the sense data line SDL for receiving the sense signal provided by the sensing circuit 220. The scan signal is used to control (enable) the bias circuit 230 and the scan transistor Ts. However, in one embodiment of the disclosure, it is optional that the bias circuit 230 is controlled by the control scan signal provided by the control scan line CSL. In addition, the scan transistor Ts may be a N-type transistor, such as a N-type metal oxide semiconductor (NMOS). In other embodiments of the disclosure, the scan transistor Ts may be a P-type transistor, such as a P-type metal oxide semiconductor (PMOS).

In the embodiment of the disclosure, the scan transistor Ts may be turned-on to provide the control signal with the data voltage Vdata to the bias circuit 230 through the sensing node N1, so that the bias circuit 230 may apply a voltage to the sensing node N1. That is, the bias circuit 230 may receive the control signal through the control data line CDL according to the scan signal. In the embodiment of the disclosure, the data voltage Vdata may be a programmable voltage. The sensing circuit 220 may perform a loop back calibration to sense the sensing node N1 to generate the sense signal according to a voltage of the sensing node N1, so that the readout circuit 240 receives the sense signal from the sense data line SDL. The readout circuit 240 provides an output signal with an output voltage Vout to an external processing circuit according to the sense signal. In the embodiment of the disclosure, the control data line CDL may provide the control scan signal with different data voltages, so that the readout circuit 240 may correspondingly provide the output signal with different output voltages. Therefore, the external processing circuit may compare the data voltage Vdata and the output voltage Vout to obtain a calibration data corresponding a relationship between the output voltage Vout and the data voltage Vdata as shown in FIG. 2B.

Figure 3:
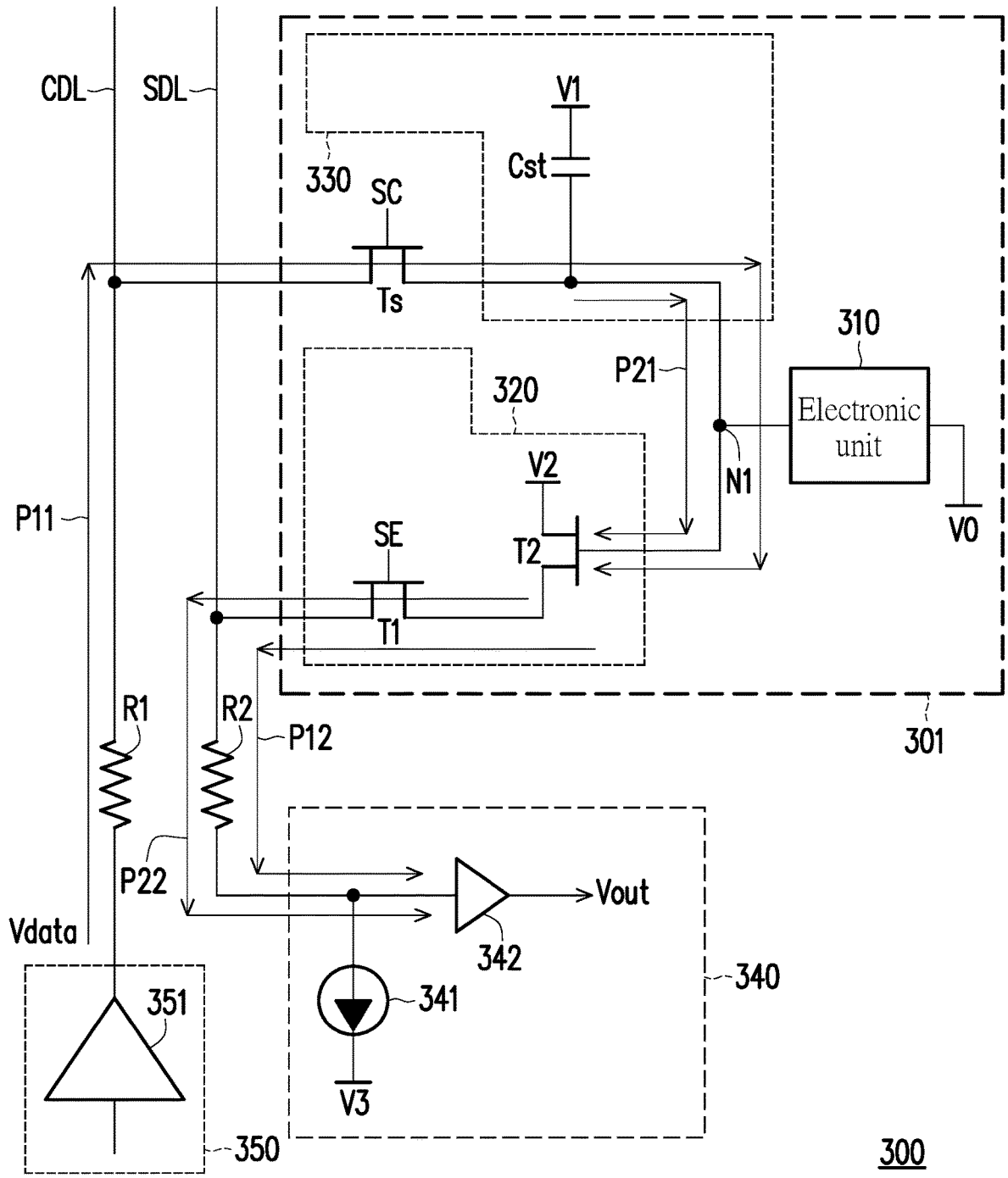
FIG. 3 is a schematic diagram of an electronic device according to an embodiment of the disclosure.

FIG. 3 is a schematic diagram of an electronic device according to an embodiment of the disclosure. Referring to FIG. 3, an electronic device 300 includes an active matrix pixel array including a plurality of pixels, and a circuit architecture of at least one of the pixels may be the same as a pixel 301. In the embodiment of the disclosure, the pixels of the electronic device 300 may be configured to perform an antenna function, and the electronic device 300 may be an active matrix voltage controlled unit, such as a varactor antenna, but the disclosure is not limited thereto. In the embodiment of the disclosure, the electronic device 300 includes the pixel 301, a readout circuit 340, a source driver integrated circuit (IC) 350, a control data line CDL and a sense data line SDL. There is a stray resistance R1 on the control data line CDL. There is a stray resistance R2 on the sense data line SDL. The pixel 301 includes a scan transistor Ts, an electronic unit 310, a bias circuit 330 (corresponding to the circuit 130 of FIG. 1) and a (voltage) sensing circuit 320. In one embodiment, the electronic unit 310 may be a voltage controlled device. The bias circuit 330 includes a storage capacitor Cst. The readout circuit 340 may be composed of a bias current source 341 and a voltage amplifier 342. The sensing circuit 320 includes a first sense transistor T1 and a second sense transistor T2. The source driver IC 350 includes a digital to analog converter (DAC) 351.

In the embodiment of the disclosure, the DAC 351 of the source driver IC 350 is electrically connected to the control data line CDL. A first terminal of the scan transistor Ts is electrically connected to the control data line CDL. An output terminal of the DAC 351 is electrically connected to the first terminal of the scan transistor Ts through the control data line CDL having the stray resistance R1. A control terminal of the scan transistor Ts receives a scan signal SC. A second terminal of the scan transistor Ts is electrically connected to a sensing node N1. A first terminal of the storage capacitor Cst is electrically connected to a voltage V1. A second terminal of the storage capacitor Cst is electrically connected to the second terminal of the scan transistor Ts and the sensing node N1. The electronic unit 310 is electrically connected between the sensing node N1 and a voltage V0. A first terminal of the first sense transistor T1 is electrically connected to the sense data line SDL. A control terminal of the first sense transistor T1 receives a sense scan signal SE. A first terminal of the second sense transistor T2 is electrically connected to a voltage V2. A control terminal of the second sense transistor T2 is electrically connected to the sensing node N1. A second terminal of the first sense transistor T1 is electrically connected to a second terminal of the second sense transistor T2. A first terminal of the bias current source 341 is electrically connected to the first terminal of the first sense transistor T1 through the sense data line SDL having the stray resistance R2. A second terminal of the bias current source 341 is electrically connected to a voltage V3. An input terminal of the voltage amplifier 342 is electrically connected to the first terminal of the first sense transistor T1 through the sense data line SDL having the stray resistance R2. An output terminal of the voltage amplifier 342 may be electrically connected to an external processing circuit.

In the embodiment of the disclosure, the scan transistor Ts, the first sense transistor T1 and the second sense transistor T2 may be a N-type transistor, respectively, such as a N-type metal oxide semiconductor (NMOS). The above-mentioned first terminal and the second terminal of the transistor may include a drain terminal and a source terminal, respectively, and the above-mentioned control terminal of the transistor may be a gate terminal. In other embodiments of the disclosure, at least one of the scan transistor Ts, the first sense transistor T1 and the second sense transistor T2 may also be a P-type transistor, such as a P-type metal oxide semiconductor (PMOS). In addition, in the embodiment of the disclosure, the voltage V2 may be greater than the voltage V3.

Figure 4:
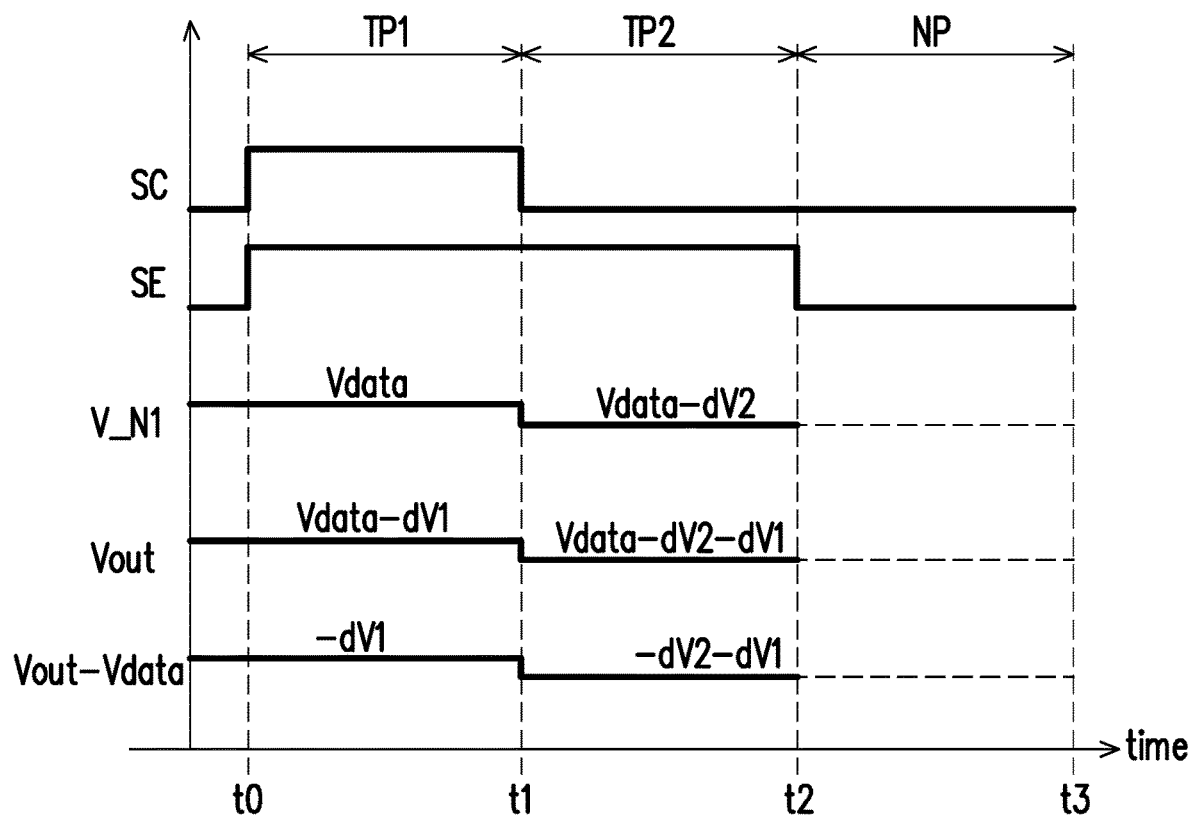
FIG. 4 is a schematic diagram of related signals and voltages according to the embodiment of FIG. 3 of the disclosure.

FIG. 4 is a schematic diagram of related signals and voltages according to the embodiment of FIG. 3 of the disclosure. Referring to FIG. 3 and FIG. 4, the electronic device 300 may be operated in a first test mode during a first test period TP1 to perform a loop back calibration, a second test mode during a second test period TP2 and a normal bias operation mode during a normal operation period NP. The first test mode is used to test or calibrate the sensing circuit 320, and the second test mode is used to test or calibrate the bias circuit 330.

During the first test period TP1 from time t0 to time t1, referring to a current path P11, the DAC 351 outputs a control signal with a data voltage Vdata to the control data line CDL. The scan transistor Ts is turned-on to transmit the data voltage Vdata to the storage capacitor Cst, the sensing node N1 and the control terminal of the second sense transistor T2 according to the scan signal SC with a high voltage level. Thus, a voltage V_N1 of the sensing node N1 may be equal to the data voltage Vdata. Then, referring to a current path P12, the first sense transistor T1 is turned-on to readout a voltage of the second terminal (source terminal) of the second sense transistor T2 corresponding to the voltage V_N1 of the sensing node N1 (i.e. a voltage of the control terminal (gate terminal) of the second sense transistor T2) according to the sense scan signal SE with the high voltage level, so as to readout a sense signal to the sense data line SDL. That is, the calibration mode of the electronic device 300 is activated when scan transistor Ts and the first sense transistor T1 are simultaneously turned-on. Thus, the voltage amplifier 342 may output an output voltage Vout according to the sense signal, and the output voltage Vout may be equal to a voltage of the data voltage Vdata minus a first delta voltage dV1 (Vdata−dV1). It should be noted that, in the embodiment of the disclosure, the first delta voltage dV1 may be caused by a threshold voltage of the second sense transistor T2, the first sense transistor T1, the stray resistance R2 and the bias current source 341. Therefore, the external processing circuit may compare the data voltage Vdata and the output voltage Vout to obtain a calibration data corresponding a relationship between the output voltage Vout and the data voltage Vdata as shown in FIG. 2B. Moreover, the external processing circuit may further calculate a voltage of the output voltage Vout minus the data voltage Vdata (Vout-Vdata) to obtain an actual voltage value of the first delta voltage dV1, so as to obtain the influence of the internal circuit characteristics of the sensing circuit 320 and the readout circuit 340 for the output voltage.

During the second test period TP2 from time t1 to time t2, referring to a current path P21, the scan transistor Ts is turned-off according to the scan signal SC with a low voltage level. The voltage of the voltage V_N1 of the sensing node N1 may be changed to a voltage of the data voltage Vdata minus a second delta voltage dV2. It should be noted that, in the embodiment of the disclosure, the second delta voltage dV2 may be caused by a leak current of the electronic unit 310. Then, referring to a current path P22, the first sense transistor T1 is turned-on to readout a voltage of the second terminal (source terminal) of the second sense transistor T2 corresponding to the voltage V_N1 of the sensing node N1 (i.e. a voltage of the control terminal (gate terminal) of the second sense transistor T2) according to the sense scan signal SE with the high voltage level, so as to provide the sense signal to the sense data line SDL. Thus, the voltage amplifier 342 may output an output voltage Vout according to the sense signal, and the output voltage Vout may be equal to a voltage of the data voltage Vdata minus the first delta voltage dV1 and minus the second delta voltage dV2 (Vdata−dV1−dV2). The external processing circuit may calculate a voltage of the output voltage Vout minus the data voltage Vdata (Vout−Vdata) to obtain a voltage value of the negative first delta voltage dV1 minus the second delta voltage dV2 (−dV1−dV2). Due to the actual voltage value of the first delta voltage dV1 has been obtained in the previous calculation, the external processing circuit may further obtain an actual voltage value of the second delta voltage dV2.

During the normal operation period NP from time t2 to time t3, the scan transistor Ts and the second sense transistor T2 are turned-off according to the scan signal SC and the sense scan signal SE with the low voltage level, respectively. Based on the bias circuit 330 is previously programed by the data voltage Vdata, the voltage of the voltage V_N1 of the sensing node N1 may be the voltage of the data voltage Vdata minus the second delta voltage dV2. That is to say, due to the actual voltage value of the second delta voltage dV2 has been obtained in the previous calculation, the external processing circuit may obtain the influence of the leak current of the electronic unit 310, and correspondingly calibrate the bias circuit 330 and adjust the data voltage Vdata of the control signal, so as to properly operate the voltage controlled unit 310 during the normal operation period NP.

Figure 5:
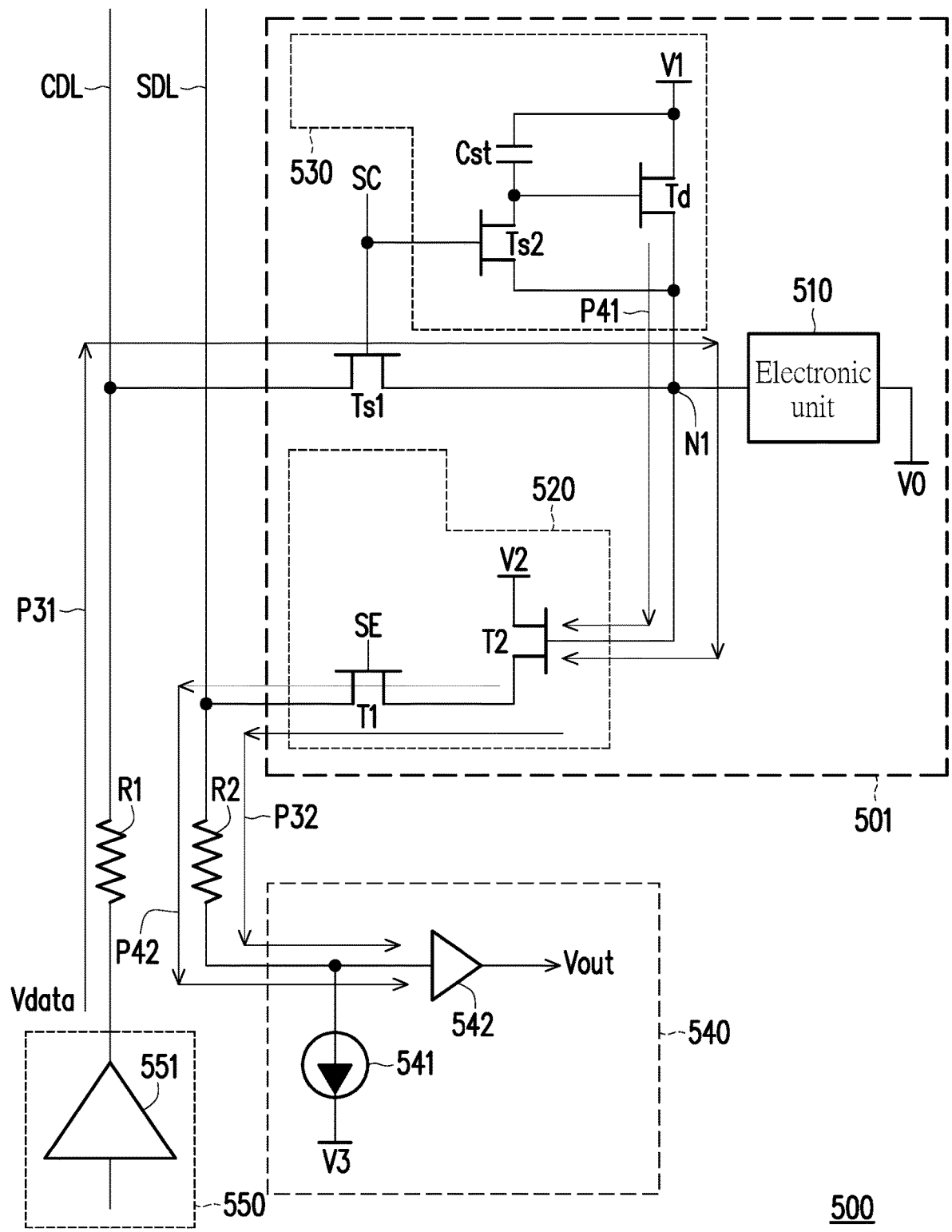
FIG. 5 is a schematic diagram of an electronic device according to an embodiment of the disclosure.

FIG. 5 is a schematic diagram of an electronic device according to an embodiment of the disclosure. Referring to FIG. 5, an electronic device 500 includes an active matrix pixel array including a plurality of pixels, and a circuit architecture of at least one of the pixels may be the same as a pixel 501. In the embodiment of the disclosure, the pixels of the electronic device 500 may be configured to perform an antenna function, and the electronic device 500 may be an active matrix voltage controlled unit, such as a varactor antenna, but the disclosure is not limited thereto. In the embodiment of the disclosure, the electronic device 500 includes the pixel 501, a readout circuit 540, a source driver integrated circuit (IC) 550, a control data line CDL and a sense data line SDL. There is a stray resistance R1 on the control data line CDL. There is a stray resistance R2 on the sense data line SDL. The pixel 501 includes a scan transistor Ts1, an electronic unit 510, a bias circuit 530 (corresponding to the circuit 130 of FIG. 1) and a (voltage) sensing circuit 520. In one embodiment, the electronic unit 510 may be a voltage controlled device. The bias circuit 530 includes a storage capacitor Cst, a drive transistor Td and a scan transistor Ts2. The readout circuit 540 may be composed of a bias current source 541 and a voltage amplifier 542. The sensing circuit 520 includes a first sense transistor T1 and a second sense transistor T2. The source driver IC 550 includes a digital to analog converter (DAC) 551.

In the embodiment of the disclosure, the DAC 551 of the source driver IC 550 is electrically connected to the control data line CDL. A first terminal of the scan transistor Ts1 is electrically connected to the control data line CDL. An output terminal of the DAC 551 is electrically connected to the first terminal of the scan transistor Ts through the control data line CDL having the stray resistance R1. A control terminal of the scan transistor Ts1 receives a scan signal SC. A second terminal of the scan transistor Ts0 is electrically connected to a sensing node N1. A first terminal of the storage capacitor Cst is electrically connected to a voltage V1. A first terminal of the drive transistor Td is electrically connected to the voltage V1. A second terminal of the drive transistor Td is electrically connected to the sensing node N1. A control terminal of the drive transistor Td is electrically connected to a second terminal of the storage capacitor Cst. A first terminal of the scan transistor Ts2 is electrically connected to the second terminal of the storage capacitor Cst and the control terminal of the drive transistor Td. A second terminal of the scan transistor Ts2 is electrically connected to the sensing node N1. A control terminal of the scan transistor Ts2 receives the scan signal SC. The drive transistor Td may be operated as a source follower amplifier electrically connected to the sensing node N1. The electronic unit 510 is electrically connected between the sensing node N1 and a voltage V0. A first terminal of the first sense transistor T1 is electrically connected to the sense data line SDL. A control terminal of the first sense transistor T1 receives a sense scan signal SE. A first terminal of the second sense transistor T2 is electrically connected to a voltage V2. A control terminal of the second sense transistor T2 is electrically connected to the sensing node N1. A second terminal of the first sense transistor T1 is electrically connected to a second terminal of the second sense transistor T2. A first terminal of the bias current source 541 is electrically connected to the first terminal of the first sense transistor T1 through the sense data line SDL having the stray resistance R2. A second terminal of the bias current source 541 is electrically connected to a voltage V3. An input terminal of the voltage amplifier 542 is electrically connected to the first terminal of the first sense transistor T1 through the sense data line SDL having the stray resistance R2. An output terminal of the voltage amplifier 542 may be electrically connected to an external processing circuit.

In the embodiment of the disclosure, the scan transistor Ts1, the scan transistor Ts2, the drive transistor Td, the first sense transistor T1 and the second sense transistor T2 may be a N-type transistor, respectively, such as a N-type metal oxide semiconductor (NMOS). The above-mentioned first terminal and the second terminal of the transistor may include a drain terminal and a source terminal, respectively, and the above-mentioned control terminal of the transistor may be a gate terminal. In other embodiments of the disclosure, the scan transistor Ts may be a P-type transistor, such as a P-type metal oxide semiconductor (PMOS). In addition, in the embodiment of the disclosure, the voltage V1 may be greater than the voltage V0, and the voltage V2 may be greater than the voltage V3.

Figure 6:
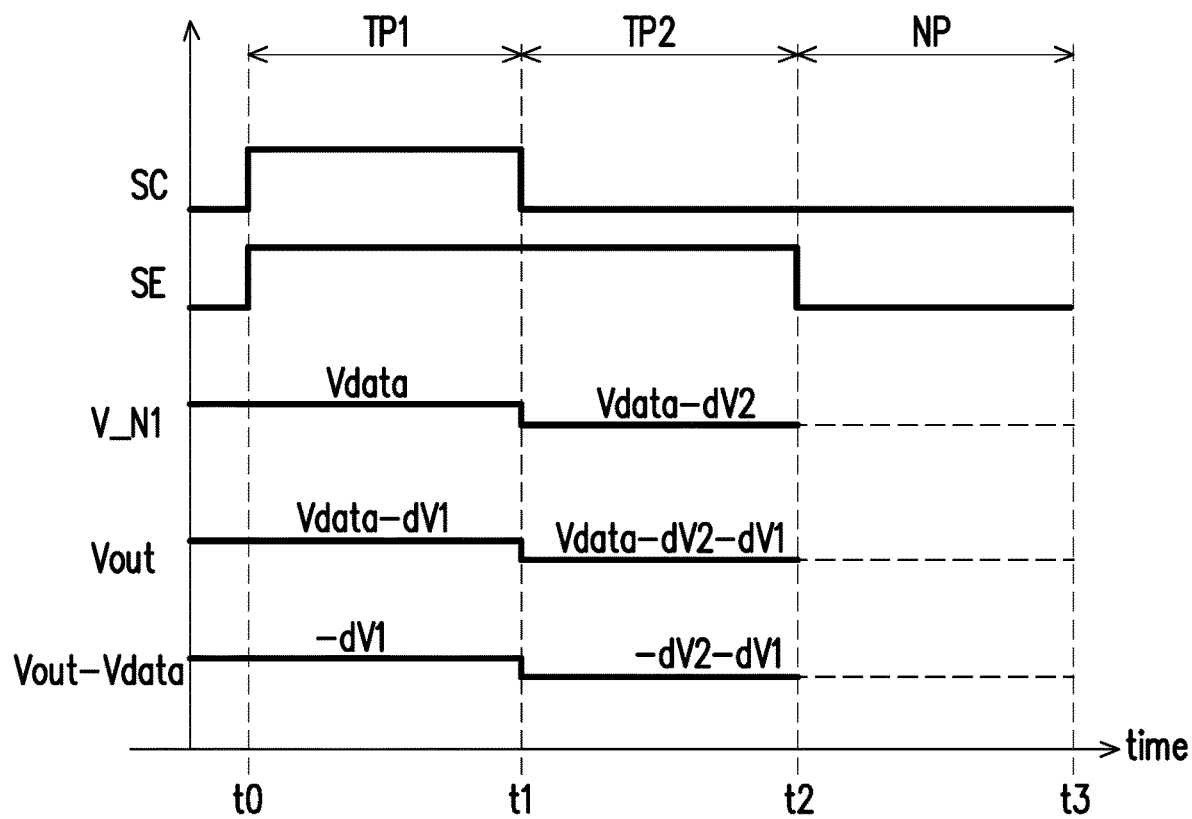
FIG. 6 is a schematic diagram of related signals and voltages according to the embodiment of FIG. 5 of the disclosure.

FIG. 6 is a schematic diagram of related signals and voltages according to the embodiment of FIG. 5 of the disclosure. Referring to FIG. 5 and FIG. 6, the electronic device 500 may be operated in a first test mode during a first test period TP1 to perform a loop back calibration, a second test mode during a second test period TP2 and a normal bias operation mode during a normal operation period NP. The first test mode is used to test or calibrate the sensing circuit 520, and the second test mode is used to test or calibrate the bias circuit 530.

During the first test period TP1 from time t0 to time t1, referring to a current path P31, the DAC 551 outputs a control signal with a data voltage Vdata to the control data line CDL. The scan transistor Ts1 and the scan transistor Ts2 are turned-on to store the data voltage Vdata into the storage capacitor Cst, the sensing node N1 and the control terminal of the second sense transistor T2 according to the scan signal SC with a high voltage level. Thus, a voltage V_N1 of the sensing node N1 may be equal to the data voltage Vdata. Then, referring to a current path P32, the first sense transistor T1 is turned-on to readout a voltage of the second terminal (source terminal) of the second sense transistor T2 corresponding to the voltage V_N1 of the sensing node N1 (i.e. a voltage of the control terminal (gate terminal) of the second sense transistor T2) according to the sense scan signal SE with the high voltage level, so as to provide a sense signal to the sense data line SDL. That is, the calibration mode of the electronic device 500 is activated when the scan transistor Ts1, the scan transistor Ts2 and the first sense transistor T1 are simultaneously turned-on. Thus, the voltage amplifier 542 may output an output voltage Vout according to the sense signal, and the output voltage Vout may be equal to a voltage of the data voltage Vdata minus a first delta voltage dV1 (Vdata−dV1). It should be noted that, in the embodiment of the disclosure, the first delta voltage dV1 may be caused by a threshold voltage of the second sense transistor T2, the first sense transistor T1, the stray resistance R2 and the bias current source 541. Therefore, the external processing circuit may compare the data voltage Vdata and the output voltage Vout to obtain a calibration data corresponding a relationship between the output voltage Vout and the data voltage Vdata as shown in FIG. 2B. Moreover, the external processing circuit may further calculate a voltage of the output voltage Vout minus the data voltage Vdata (Vout−Vdata) to obtain an actual voltage value of the first delta voltage dV1, so as to obtain the influence of the internal circuit characteristics of the sensing circuit 520 and the readout circuit 540 for the output voltage.

During the second test period TP2 from time t1 to time t2, referring to a current path P41, the scan transistor Ts1 and the scan transistor Ts2 are turned-off according to the scan signal SC with a low voltage level. The voltage of the voltage V_N1 of the sensing node N1 may be changed to a voltage of the data voltage Vdata minus a second delta voltage dV2. It should be noted that, in the embodiment of the disclosure, the second delta voltage dV2 may be caused by a threshold voltage of the drive transistor Td and a leak current of the electronic unit 510. Then, referring to a current path P42, the first sense transistor T1 is turned-on to readout a voltage of the second terminal (source terminal) of the second sense transistor T2 corresponding to the voltage V_N1 of the sensing node N1 (i.e. a voltage of the control terminal (gate terminal) of the second sense transistor T2) according to the sense scan signal SE with the high voltage level, so as to provide the sense signal to the sense data line SDL. Thus, the voltage amplifier 542 may output an output voltage Vout according to the sense signal, and the output voltage Vout may be equal to a voltage of the data voltage Vdata minus the first delta voltage dV1 and minus the second delta voltage dV2 (Vdata−dV1−dV2). The external processing circuit may calculate a voltage of the output voltage Vout minus the data voltage Vdata (Vout−Vdata) to obtain a voltage value of the negative first delta voltage dV1 minus the second delta voltage dV2 (−dV1−dV2). Due to the actual voltage value of the first delta voltage dV1 has been obtained in the previous calculation, the external processing circuit may further obtain an actual voltage value of the second delta voltage dV2.

During the normal operation period NP from time t2 to time t3, the scan transistor Ts1, the scan transistor Ts2 and the second sense transistor T2 are turned-off according to the scan signal SC and the sense scan signal SE with the low voltage level, respectively. Based on the bias circuit 530 is previously programed by the data voltage Vdata, the voltage of the voltage V_N1 of the sensing node N1 may be the voltage of the data voltage Vdata minus the second delta voltage dV2. That is to say, due to the actual voltage value of the second delta voltage dV2 has been obtained in the previous calculation, the external processing circuit may obtain the influence of the threshold voltage of the drive transistor Td of the bias circuit 530 and the leak current of the voltage controlled unit 510, and correspondingly calibrate the bias circuit 530 and adjust the data voltage Vdata of the control signal, so as to properly operate the voltage controlled unit 510 during the normal operation period NP.

Figure 7A:
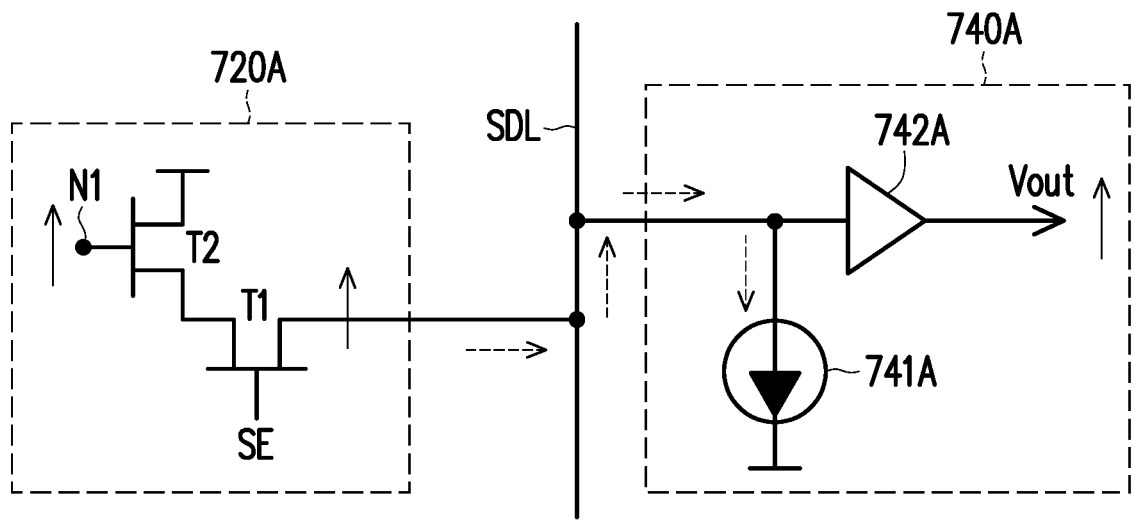
FIG. 7A is a first type of the sensing circuit and the readout circuit according to an embodiment of the disclosure.

FIG. 7A is a first type of the sensing circuit and the readout circuit according to an embodiment of the disclosure. Referring to FIG. 7A, the sensing circuits 320, 520 and the readout circuits 340, 540 of the above-mentioned embodiments of FIG. 3 and FIG. 5 may be realized as the sensing circuit 720A and the readout circuit 740A of the voltage sensing circuit of FIG. 7A. In the embodiment of the disclosure, the sensing circuit 720A includes a first sense transistor T1 and a second sense transistor T2. The readout circuit 740A may be composed of a bias current source 741A and a voltage amplifier 742A. In the embodiment of the disclosure, the first sense transistor T1 and the second sense transistor T2 may be a N-type transistor, respectively, such as a N-type metal oxide semiconductor (NMOS). In the embodiment of the disclosure, the sensing circuit 720A is a voltage mode sensing circuit, and the readout circuit 740A is a voltage mode readout circuit.

In the embodiment of the disclosure, a first terminal of the first sense transistor T1 is electrically connected to a sense data line SDL. A control terminal of the first sense transistor T1 receives a sense scan signal SE. A first terminal of the second sense transistor T2 is electrically connected to a voltage (may have a high voltage level). A control terminal of the second sense transistor T2 is electrically connected to a sensing node N1. A second terminal of the first sense transistor T1 is electrically connected to a second terminal of the second sense transistor T2. A first terminal of the bias current source 741A is electrically connected to the first terminal of the first sense transistor T1 through the sense data line SDL. A second terminal of the bias current source 741A is electrically connected to another voltage (may have a low voltage level). An input terminal of the voltage amplifier 742A is electrically connected to the first terminal of the first sense transistor T1 through the sense data line SDL. An output terminal of the voltage amplifier 742A may be electrically connected to an external processing circuit.

In the embodiment of the disclosure, the second sense transistor T2 may be operated as a source follower amplifier. When a voltage of the sensing node N1 rises (during the above-mentioned test modes) and the first sense transistor T1 is turned-on by the sense scan signal SE having a high voltage level, a voltage of the first terminal of the first sense transistor T1 is correspondingly pulled-up by the second sense transistor T2. Thus, a current corresponding to the voltage of the sensing node N1 is formed to flow from the first terminal of the first sense transistor T1 to the bias current source 741A through the sense data line SDL. Then, the input terminal of the voltage amplifier 742A may receive the voltage of the first terminal of the first sense transistor T1, so that an output voltage Vout output by the output terminal of the voltage amplifier 742A is correspondingly pulled-up. Therefore, the external processing circuit may effectively receive a sensing result of the voltage of the sensing node N1 for calibration of the sensing circuit 720A according to the output voltage Vout.

Figure 7B:
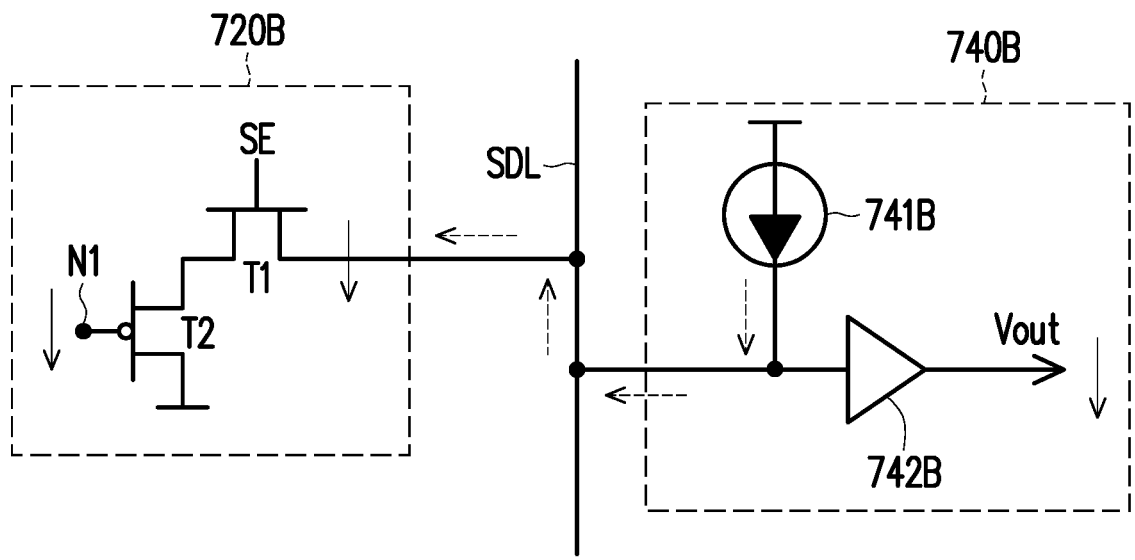
FIG. 7B is a second type of the sensing circuit and the readout circuit according to an embodiment of the disclosure.

FIG. 7B is a second type of the sensing circuit and the readout circuit according to an embodiment of the disclosure. Referring to FIG. 7B, the sensing circuits 320, 520 and the readout circuits 340, 540 of the above-mentioned embodiments of FIG. 3 and FIG. 5 may be realized as the sensing circuit 720B and the readout circuit 740B of the voltage sensing circuit of FIG. 7B. In the embodiment of the disclosure, the sensing circuit 720B includes a first sense transistor T1 and a second sense transistor T2. The readout circuit 740B may be composed of a bias current source 741B and a voltage amplifier 742B. In the embodiment of the disclosure, the first sense transistor T1 may be a N-type transistor, such as a N-type metal oxide semiconductor (NMOS), and the second sense transistor T2 may be a P-type transistor, such as a P-type metal oxide semiconductor (PMOS). In the embodiment of the disclosure, the sensing circuit 720B is a voltage mode sensing circuit, and the readout circuit 740B is a voltage mode readout circuit.

In the embodiment of the disclosure, a first terminal of the first sense transistor T1 is electrically connected to a sense data line SDL. A control terminal of the first sense transistor T1 receives a sense scan signal SE. A first terminal of the second sense transistor T2 is electrically connected to a voltage (may have a low voltage level). A control terminal of the second sense transistor T2 is electrically connected to a sensing node N1. A second terminal of the first sense transistor T1 is electrically connected to a second terminal of the second sense transistor T2. A first terminal of the bias current source 741B is electrically connected to another voltage (may have a high voltage level). A second terminal of the bias current source 741B is electrically connected to the first terminal of the first sense transistor T1 through the sense data line SDL. An input terminal of the voltage amplifier 742B is electrically connected to the first terminal of the first sense transistor T1 through the sense data line SDL. An output terminal of the voltage amplifier 742B may be electrically connected to an external processing circuit.

In the embodiment of the disclosure, the second sense transistor T2 may be operated as a source follower amplifier. When a voltage of the sensing node N1 drops (during the above-mentioned test modes) and the first sense transistor T1 is turned-on by the sense scan signal SE having a high voltage level, a voltage of the first terminal of the first sense transistor T1 is correspondingly pulled-down by the second sense transistor T2. Thus, a current corresponding to the voltage of the sensing node N1 is formed to flow from the bias current source 741B to the first terminal of the first sense transistor T1 through the sense data line SDL. Then, the input terminal of the voltage amplifier 742B may receive the dropped voltage of the first terminal of the first sense transistor T1, so that an output voltage Vout output by the output terminal of the voltage amplifier 742B is correspondingly pulled-down. Therefore, the external processing circuit may effectively receive a sensing result of the voltage of the sensing node N1 for calibration of the sensing circuit 720B according to the output voltage Vout.

Figure 7C:
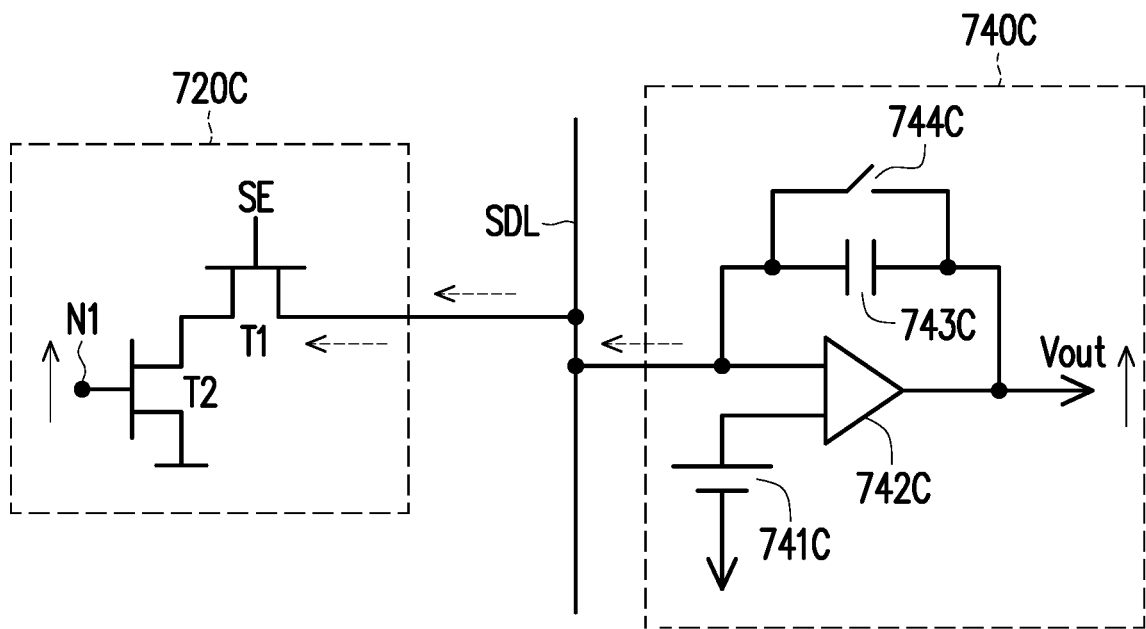
FIG. 7C is a third type of the sensing circuit and the readout circuit according to an embodiment of the disclosure.

FIG. 7C is a third type of the sensing circuit and the readout circuit according to an embodiment of the disclosure. Referring to FIG. 7C, the sensing circuits 320, 520 and the readout circuits 340, 540 of the above-mentioned embodiments of FIG. 3 and FIG. 5 may be realized as the sensing circuit 720C and the readout circuit 740C of the voltage sensing circuit of FIG. 7C. In the embodiment of the disclosure, the sensing circuit 720C includes a first sense transistor T1 and a second sense transistor T2. The readout circuit 740C may be composed of a bias voltage source 741C, an operational amplifier 742C, a capacitor 743C and a switch 744C to form a charge integrator to convert current to voltage. In the embodiment of the disclosure, the first sense transistor T1 and the second sense transistor T2 may be a N-type transistor, respectively, such as a N-type metal oxide semiconductor (NMOS). In the embodiment of the disclosure, the sensing circuit 720C is a current mode sensing circuit, and the readout circuit 740C is a current mode readout circuit.

In the embodiment of the disclosure, a first terminal of the first sense transistor T1 is electrically connected to a sense data line SDL. A control terminal of the first sense transistor T1 receives a sense scan signal SE. A first terminal of the second sense transistor T2 is electrically connected to a voltage (may have a low voltage level). A control terminal of the second sense transistor T2 is electrically connected to a sensing node N1. A second terminal of the first sense transistor T1 is electrically connected to a second terminal of the second sense transistor T2. A first terminal of the bias voltage source 741C is electrically connected to a first input terminal of the operational amplifier 742C. A second terminal of the bias voltage source 741C is electrically connected to another voltage (may have the low voltage level). A second input terminal of the operational amplifier 742C is electrically connected to the first terminal of the first sense transistor T1 through the sense data line SDL. A first terminal of the capacitor 743C is electrically connected to an output terminal of the operational amplifier 742C. A second terminal of the capacitor 743C is electrically connected to the second input terminal of the operational amplifier 742C. A first terminal of the switch 744C is electrically connected to an output terminal of the operational amplifier 742C. A second terminal of the switch 744C is electrically connected to the second input terminal of the operational amplifier 742C.

In the embodiment of the disclosure, the second sense transistor T2 may be operated as a current driver. When a voltage of the sensing node N1 rises (during the above-mentioned test modes) and the first sense transistor T1 is turned-on by the sense scan signal SE having a high voltage level, a current of the first terminal of the first sense transistor T1 is correspondingly sink by the second sense transistor T2. Thus, a current corresponding to the voltage of the sensing node N1 is formed to flow from the second input terminal of the operational amplifier 742C to the first terminal of the first sense transistor T1 through the sense data line SDL. Then, an output voltage Vout output by the output terminal of the operational amplifier 742C is correspondingly pulled up to keep a voltage of the second terminal of the operational amplifier 742C as same as a voltage of the first terminal of the operational amplifier 742C through the capacitor 743C. Therefore, the external processing circuit may effectively receive a sensing result of the voltage of the sensing node N1 for calibration of the sensing circuit 720C according to the output voltage Vout.

Figure 7D:
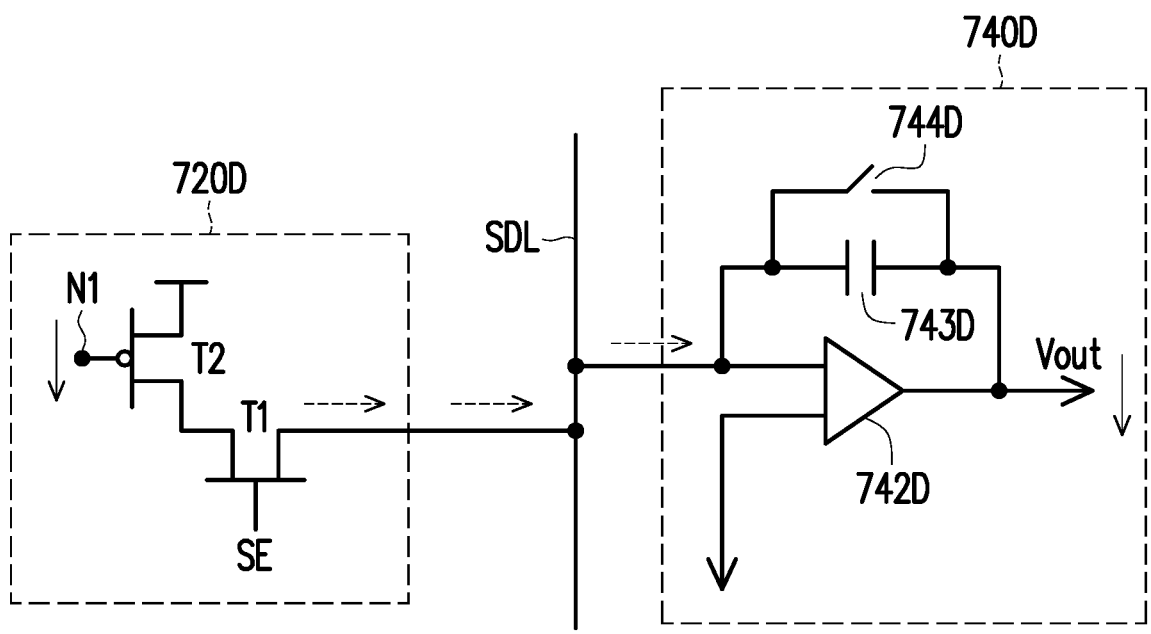
FIG. 7D is a fourth type of the sensing circuit and the readout circuit according to an embodiment of the disclosure.

FIG. 7D is a fourth type of the sensing circuit and the readout circuit according to an embodiment of the disclosure. Referring to FIG. 7D, the sensing circuits 320, 520 and the readout circuits 340, 540 of the above-mentioned embodiments of FIG. 3 and FIG. 5 may be realized as the sensing circuit 720D and the readout circuit 740D of the voltage sensing circuit of FIG. 7D. In the embodiment of the disclosure, the sensing circuit 720D includes a first sense transistor T1 and a second sense transistor T2. The readout circuit 740D may be composed of a capacitor 743D and a switch 744D to form a charge integrator to convert current to voltage. In the embodiment of the disclosure, the first sense transistor T1 may be an N-type transistor, such as an N-type metal oxide semiconductor (NMOS), and the second sense transistor T2 may be a P-type transistor, such as a P-type metal oxide semiconductor (PMOS). In the embodiment of the disclosure, the sensing circuit 720D is an operational amplifier, and the readout circuit 740D is a current mode readout circuit.

In the embodiment of the disclosure, a first terminal of the first sense transistor T1 is electrically connected to a sense data line SDL. A control terminal of the first sense transistor T1 receives a sense scan signal SE. A first terminal of the second sense transistor T2 is electrically connected to a voltage (may have a low voltage level). A control terminal of the second sense transistor T2 is electrically connected to a sensing node N1. A second terminal of the first sense transistor T1 is electrically connected to a second terminal of the second sense transistor T2. A first input terminal of the operational amplifier 742D is electrically connected to another voltage (may have the low voltage level). A second input terminal of the operational amplifier 742D is electrically connected to the first terminal of the first sense transistor T1 through the sense data line SDL. A first terminal of the capacitor 743D is electrically connected to an output terminal of the operational amplifier 742D. A second terminal of the capacitor 743D is electrically connected to the second input terminal of the operational amplifier 742D. A first terminal of the switch 744D is electrically connected to an output terminal of the operational amplifier 742D. A second terminal of the switch 744D is electrically connected to the second input terminal of the operational amplifier 742D.

In the embodiment of the disclosure, the second sense transistor T2 may be operated as a current driver. When a voltage of the sensing node N1 drops (during the above-mentioned test modes) and the first sense transistor T1 is turned-on by the sense scan signal SE having a high voltage level, a current flowing through the first terminal of the first sense transistor T1 is correspondingly sourced from the second sense transistor T2. Thus, a current corresponding to the voltage of the sensing node N1 is formed to flow from the first terminal of the first sense transistor T1 to the second input terminal of the operational amplifier 742D through the sense data line SDL. Then, an output voltage Vout output by the output terminal of the operational amplifier 742D is correspondingly pulled down to keep a voltage of the second terminal of operational amplifier 742D as same as a voltage of the first terminal of the operational amplifier 742D through the capacitor 743D. Therefore, the external processing circuit may effectively receive a sensing result of the voltage of the sensing node N1 for calibration of the sensing circuit 720D according to the output voltage Vout.

Figure 8A:
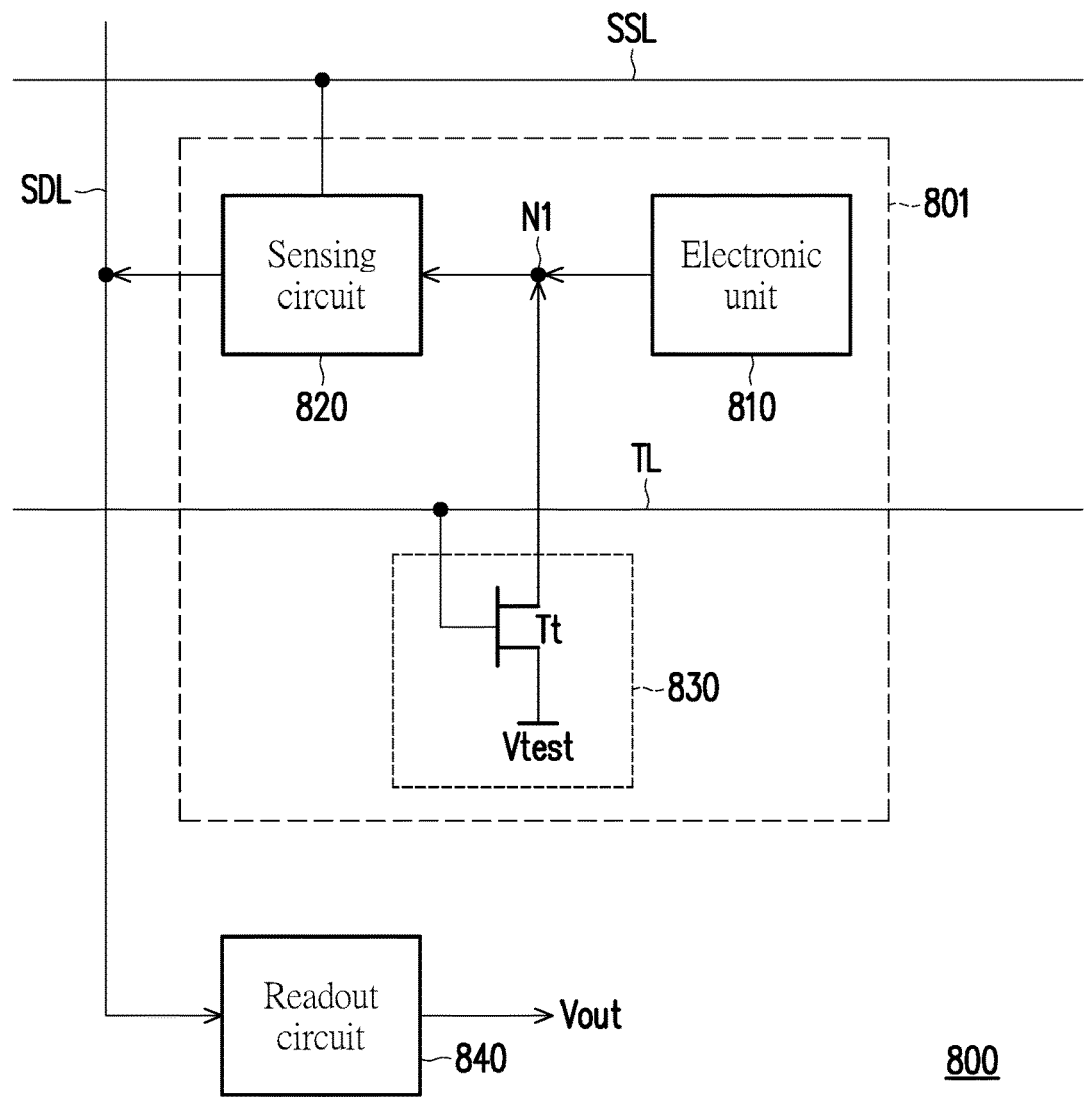
FIG. 8A is a schematic diagram of an electronic device according to an embodiment of the disclosure.
Figure 8B:
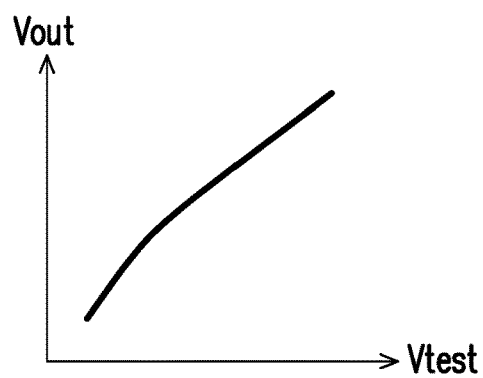
FIG. 8B is a schematic diagram of a relationship between an output voltage and a test voltage according to an embodiment of the disclosure.

FIG. 8A is a schematic diagram of an electronic device according to an embodiment of the disclosure. FIG. 8B is a schematic diagram of a relationship between an output voltage and a test voltage according to an embodiment of the disclosure. Referring to FIG. 8A and FIG. 8B, an electronic device 800 includes an active matrix pixel array including a plurality of pixels, and a circuit architecture of at least one of the pixels may be the same as a pixel 801 of FIG. 8A. The electronic device 800 may be an active matrix sensing unit. In the embodiment of the disclosure, the electronic device 800 includes the pixel 801, a readout circuit 840, a sense data line SDL, a test line TL and a sense scan line SSL. The sense data line SDL may be electrically connected to multiple pixels in one column of the active matrix pixel array, respectively. The test line TL and the sense scan line SSL may be electrically connected to multiple pixels in one row of the active matrix pixel array, respectively. The pixel 801 includes an electronic unit 810, a sensing circuit 820 and a test circuit 830 (corresponding to the circuit 130 of FIG. 1). The test circuit 830 includes a test transistor Tt.

In the embodiment of the disclosure, the sensing circuit 820 is electrically connected to the electronic unit 810 through a sensing node N1. The test circuit 830 is electrically connected to the sensing node N1. The sensing circuit 820 is electrically connected to the sense scan line SSL for receiving a sense scan signal, and is electrically connected to the sense data line SDL for providing a sense signal. The sense scan signal is used to control (enable) the sensing circuit 820. The test circuit 830 is electrically connected to the test line TL for receiving a test control signal. A control terminal of the test transistor Tt is electrically connected to the test line TL. A first terminal of the test transistor Tt is electrically connected to the sensing node N1. A second terminal of the test transistor Tt is electrically connected to a common voltage source to receive a reset signal with the test voltage Vtest. The readout circuit 840 is electrically connected to the sense data line SDL for receiving the sense signal provided by the sensing circuit 820. In addition, the test transistor Tt may be an N-type transistor, such as an N-type metal oxide semiconductor (NMOS). In other embodiments of the disclosure, the test transistor Tt may be a P-type transistor, such as a P-type metal oxide semiconductor (PMOS).

In the embodiment of the disclosure, the test transistor Tt may be turned-on to apply the test voltage Vtest to the electronic unit 810 through the sensing node N1. In the embodiment of the disclosure, the sensing circuit 820 and the test circuit 830 may perform a loop back calibration to sense the sensing node N1 to generate the sense signal according to a voltage of the sensing node N1, so that the readout circuit 840 receives the sense signal from the sense data line SDL. The readout circuit 840 provides an output signal with an output voltage Vout to an external processing circuit according to the sense signal. In the embodiment of the disclosure, the test line TL may provide the different test voltages Vtest to the sensing node N1, so that the readout circuit 840 may correspondingly provide the output signal with different output voltages. Therefore, the external processing circuit may compare the test voltage Vtest and the output voltage Vout to obtain a calibration data corresponding a relationship between the output voltage Vout and the test voltage Vtest as shown in FIG. 8B.

Figure 9:
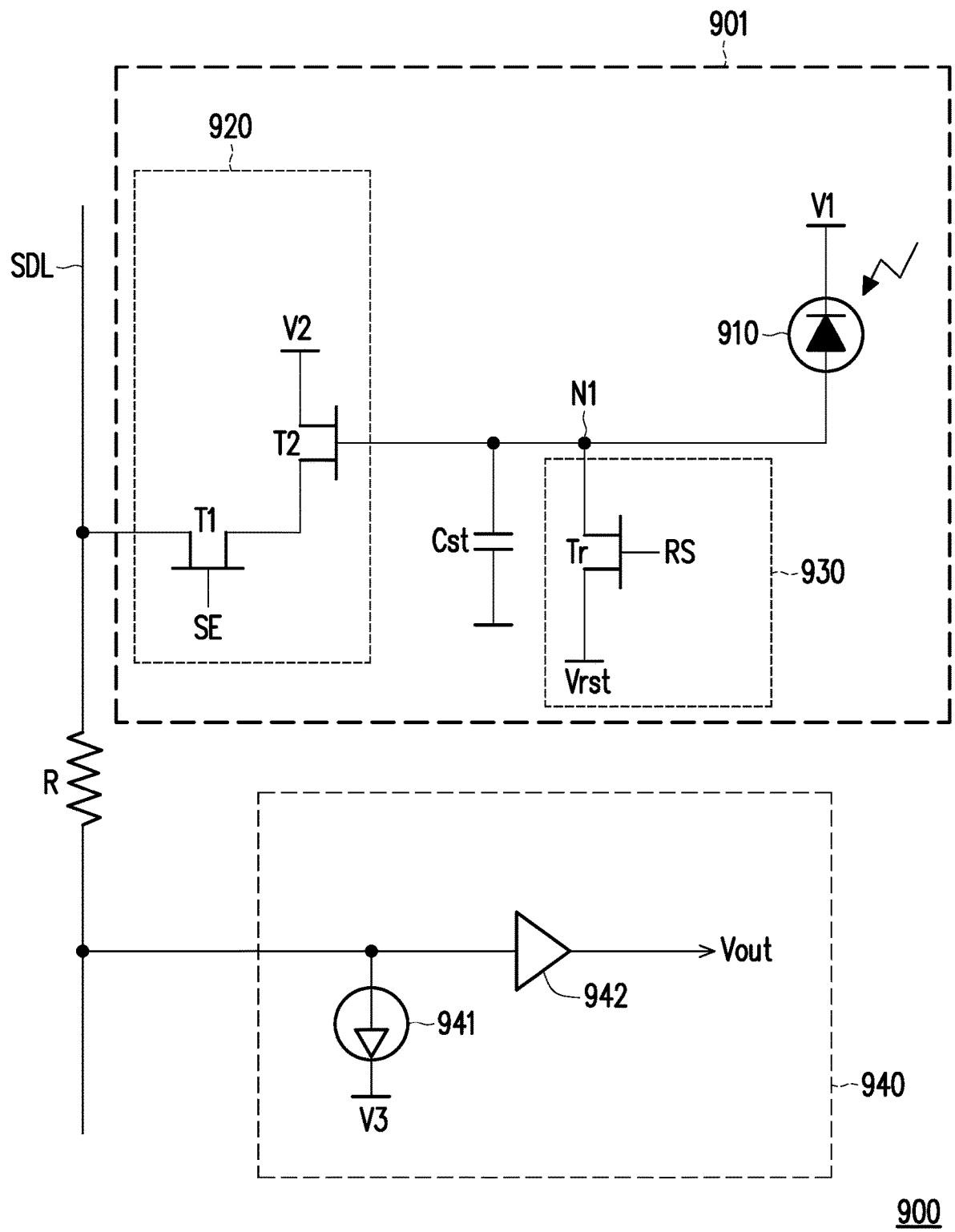
FIG. 9 is a schematic diagram of an electronic device according to an embodiment of the disclosure.

FIG. 9 is a schematic diagram of an electronic device according to an embodiment of the disclosure. Referring to FIG. 9, an electronic device 900 includes an active matrix pixel array including a plurality of pixels, and a circuit architecture of at least one of the pixels may be the same as a pixel 901. In the embodiment of the disclosure, the pixels of the electronic device 900 may be configured to sense light, and the electronic device 900 may be an active matrix sensor, such as a fingerprint sensor or an X-ray flat panel detector (FPD), but the disclosure is not limited thereto. In the embodiment of the disclosure, the electronic device 900 includes the pixel 901, a readout circuit 940 and a sense data line SDL. There is a stray resistance R on the sense data line SDL. The pixel 901 includes a storage capacitor Cst, an electronic unit 910, a (voltage) sensing circuit 920 and a reset circuit 930 (corresponding to the circuit 130 of FIG. 1). The readout circuit 940 may be composed of a bias current source 941 and a voltage amplifier 942. The sensing circuit 920 includes a first sense transistor T1 and a second sense transistor T2. The reset circuit 930 includes a reset transistor Tr (may be used as the test transistor Tt of embodiment of FIG. 8A in a calibration mode). In the embodiment of the disclosure, the electronic unit 910 may be a photodiode, but the disclosure is not limited thereto.

In the embodiment of the disclosure, a first terminal (cathode) of the electronic unit 910 is electrically connected to a voltage V1. A second terminal (anode) of the electronic unit 910 is electrically connected to a sensing node N1. A first terminal of the reset transistor Tr is electrically connected to the sensing node N1. A second terminal of the reset transistor Tr is electrically connected to a reset voltage Vrst (may be used as the test voltage Vtest of embodiment of FIG. 8A). A control terminal of the reset transistor Tr receives a reset signal (may be used as the test control signal of embodiment of FIG. 8A). A first terminal of the storage capacitor Cst is electrically connected to the sensing node N1. A second terminal of the storage capacitor Cst may be electrically connected to a specific DC voltage (e.g. a ground voltage). A first terminal of the first sense transistor T1 is electrically connected to the sense data line SDL. A control terminal of the first sense transistor T1 receives a sense scan signal SE. A first terminal of the second sense transistor T2 is electrically connected to a voltage V2. A control terminal of the second sense transistor T2 is electrically connected to the sensing node N1. A second terminal of the first sense transistor T1 is electrically connected to a second terminal of the second sense transistor T2. A first terminal of the bias current source 941 is electrically connected to the first terminal of the first sense transistor T1 through the sense data line SDL having the stray resistance R. A second terminal of the bias current source 941 is electrically connected to a voltage V3. An input terminal of the voltage amplifier 942 is electrically connected to the first terminal of the first sense transistor T1 through the sense data line SDL having the stray resistance R. An output terminal of the voltage amplifier 942 may be electrically connected to an external processing circuit.

In the embodiment of the disclosure, the reset transistor Tr, the first sense transistor T1 and the second sense transistor T2 may be an N-type transistor, respectively, such as an N-type metal oxide semiconductor (NMOS). The above-mentioned first terminal and the second terminal of the transistor may include a drain terminal and a source terminal, respectively, and the above-mentioned control terminal of the transistor may be a gate terminal. In addition, in the embodiment of the disclosure, the voltage V1 may be greater than the reset voltage Vrst, and the voltage V2 may be greater than the voltage V3.

In the embodiment of the disclosure, the second sense transistor T2 may be operated as a source follower amplifier. When a voltage of the sensing node N1 rises and the first sense transistor T1 is turned-on by the sense scan signal SE having a high voltage level, a voltage of the first terminal of the first sense transistor T1 is correspondingly pulled-up by the second sense transistor T2. Thus, a current corresponding to the voltage of the sensing node N1 is formed to flow from the first terminal of the first sense transistor T1 to the bias current source 941 through the sense data line SDL. Then, the input terminal of the voltage amplifier 942 may receive the voltage of the first terminal of the first sense transistor T1, so that an output voltage Vout output by the output terminal of the voltage amplifier 942 is correspondingly pulled-up. Therefore, the external processing circuit may effectively receive a sensing result of the voltage of the sensing node N1 for calibration of the sensing circuit 920 according to the output voltage Vout.

Figure 10:
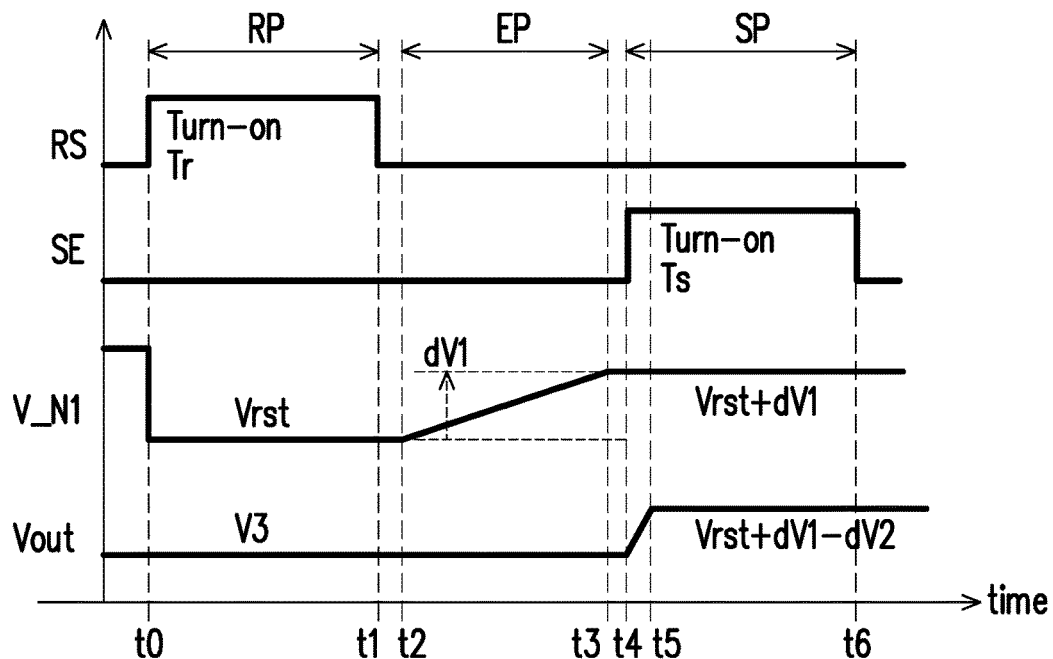
FIG. 10 is a schematic diagram of related signals and voltages of a normal mode according to the embodiment of FIG. 9 of the disclosure.

FIG. 10 is a schematic diagram of related signals and voltages of a normal mode according to the embodiment of FIG. 9 of the disclosure. Referring to FIG. 9 and FIG. 10, the electronic device 900 may be operated in a normal mode (i.e. the sensing mode) during a reset period RP to perform a reset operation, an expose period EP to perform an expose operation and a sense period SP to perform a sense operation.

During to the reset period RP from time t0 to time t1, the reset transistor Tr is turned-on according to the reset signal RS having a high voltage level, and the first sense transistor T1 is turned-off according to the sense scan signal SE having a low voltage level. Thus, a voltage V_N1 of the sensing node N1 may be changed to the reset voltage Vrst, and the output voltage Vout may be the voltage V3.

During the expose period EP from time t2 to time t3, the reset transistor Tr is turned-off according to the reset signal RS changing to the low voltage level, and the first sense transistor T1 is turned-off according to the sense scan signal SE having the low voltage level. The electronic unit 910 may perform the expose operation. Thus, the voltage V_N1 of the sensing node N1 may be pulled-up by receiving a photo leak current from the electronic unit 910. After time t3, the voltage V_N1 of the sensing node N1 may become a voltage of the reset voltage Vrst plus a first delta voltage dV1. It should be noted that, in the embodiment of the disclosure, the first delta voltage dV1 may be caused by the photo leak current from the electronic unit 910 when the electronic unit 910 senses a target object. The first delta voltage dV1 may correspond to an accurate sensing value of the target object.

During to sense period SP from time t4 to time t6, the reset transistor Tr is turned-off according to the reset signal RS having the low voltage level, and the first sense transistor T1 is turned-on according to the sense scan signal SE having the high voltage level. Thus, the sensing circuit 920 may sense the voltage V_N1 of the sensing node N1, and the voltage amplifier 942 may correspondingly output the output voltage Vout as a sensing result to the external processing circuit. The output voltage Vout may be a voltage of the reset voltage Vrst plus the first delta voltage dV1, and minus a second delta voltage dV2. It should be noted that, in the embodiment of the disclosure, the second delta voltage dV2 may be caused by a threshold voltage of the second sense transistor T2, the first sense transistor T1, the stray resistance R and the bias current source 941.

Figure 11:
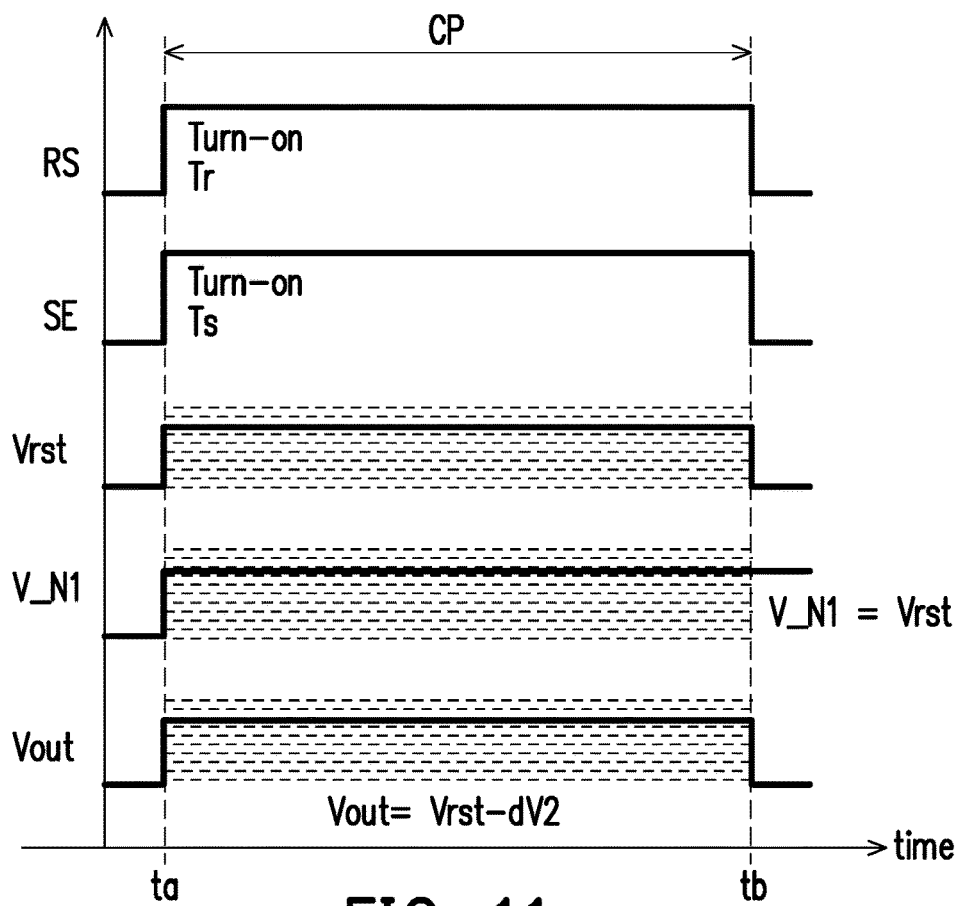
FIG. 11 is a schematic diagram of related signals and voltages of a calibration mode according to the embodiment of FIG. 9 of the disclosure.

FIG. 11 is a schematic diagram of related signals and voltages of a calibration mode according to the embodiment of FIG. 9 of the disclosure. Referring to FIG. 9 and FIG. 11, the electronic device 900 may be operated in a calibration mode during a calibration period CP to perform a loop back calibration. During the calibration period CP form time ta to time tb, the reset transistor Tr is turned-on according to the reset signal RS having the high voltage level, and the first sense transistor T1 is turned-on according to the sense scan signal SE having the high voltage level. That is, the calibration mode of the electronic device 900 is activated when the reset transistor Tr and the first sense transistor T1 are simultaneously turned-on. In the embodiment of the disclosure, the reset voltage Vrst may be used as a test voltage. The voltage V_N1 of the sensing node N1 may be changed to the reset voltage Vrst, and the output voltage Vout may be a voltage of the reset voltage Vrst minus a second delta voltage dV2. Thus, the external processing circuit may compare the reset voltage Vrst (i.e. test voltage) and the output voltage Vout to obtain a calibration data corresponding a relationship between the output voltage Vout and the reset voltage Vrst (i.e. test voltage) as shown in FIG. 8B. Moreover, the external processing circuit may calculate the second delta voltage dV2 by subtracting the output voltage Vout from the reset voltage Vrst. Therefore, the external processing circuit may effectively calibrate the above-mentioned sensing result to obtain the first delta voltage dV1 representing the real sensing result.

Figure 12:
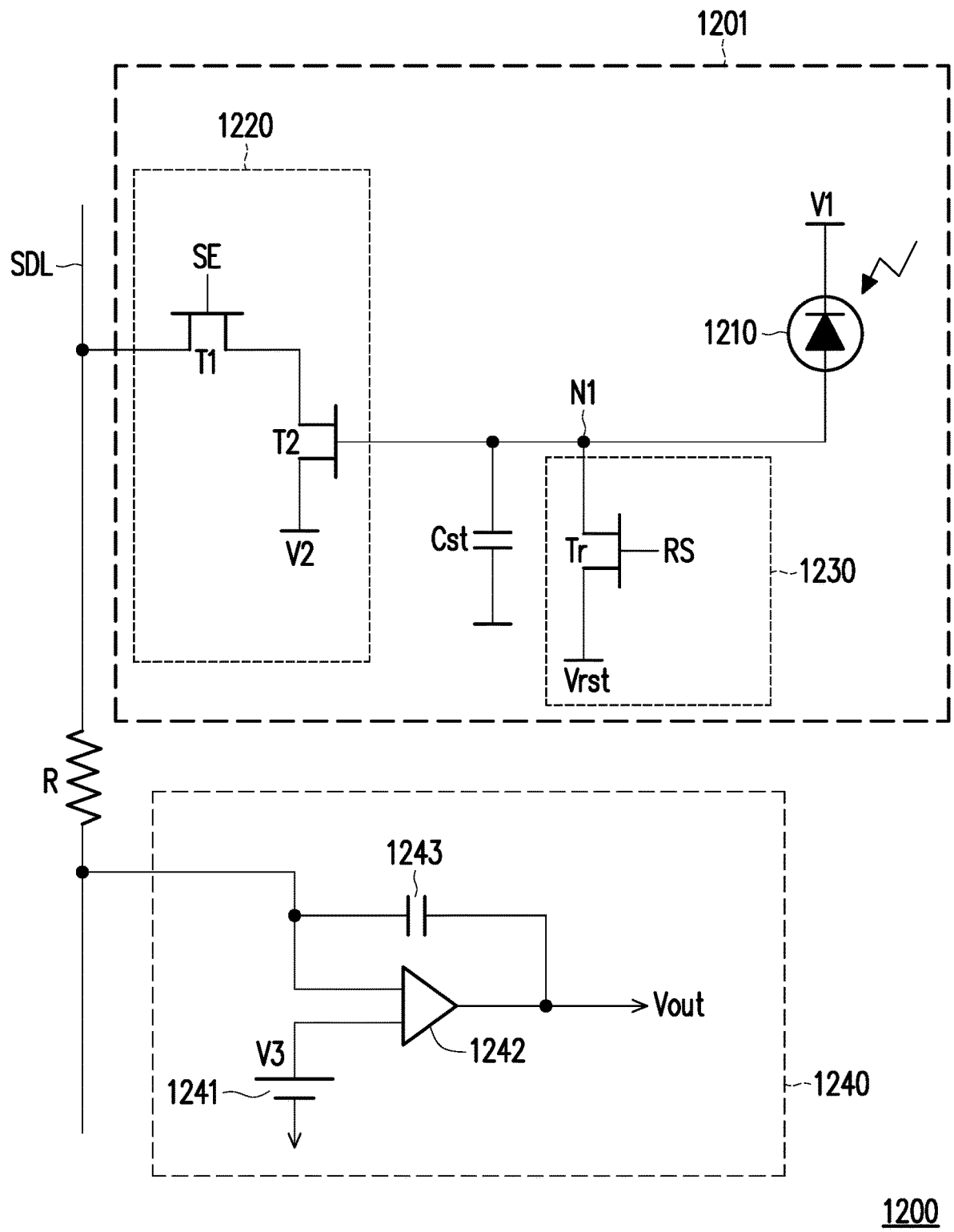
FIG. 12 is a schematic diagram of an electronic device according to an embodiment of the disclosure.

FIG. 12 is a schematic diagram of an electronic device according to an embodiment of the disclosure. Referring to FIG. 12, an electronic device 1200 includes an active matrix pixel array including a plurality of pixels, and a circuit architecture of at least one of the pixels may be the same as a pixel 1201. In the embodiment of the disclosure, the pixels of the electronic device 1200 may be configured to sense light, and the electronic device 1200 may be an active matrix sensor, such as a fingerprint sensor or an X-ray flat panel detector (FPD), but the disclosure is not limited thereto. In the embodiment of the disclosure, the electronic device 1200 includes the pixel 1201, a readout circuit 1240 and a sense data line SDL. There is a stray resistance R on the sense data line SDL. The pixel 1201 includes a storage capacitor Cst, an electronic unit 1210, a (voltage) sensing circuit 1220 and a reset circuit 1230. The readout circuit 1240 may be composed of a bias voltage source 1241, an operational amplifier 1242 and a capacitor 1243 to form an charge integrator to convert current to voltage. The sensing circuit 1220 includes a first sense transistor T1 and a second sense transistor T2. The reset circuit 1230 includes a reset transistor Tr (may be used as the test transistor Tt of embodiment of FIG. 8A in a calibration mode). In the embodiment of the disclosure, the electronic unit 1210 may be a photodiode, but the disclosure is not limited thereto.

In the embodiment of the disclosure, a first terminal (cathode) of the electronic unit 1210 is electrically connected to a voltage V1. A second terminal (anode) of the electronic unit 1210 is electrically connected to a sensing node N1. A first terminal of the reset transistor Tr is electrically connected to the sensing node N1. A second terminal of the reset transistor Tr is electrically connected to a reset voltage Vrst (may be used as the test voltage Vtest of embodiment of FIG. 8A). A control terminal of the reset transistor Tr receives a reset signal (may be used as the test control signal of embodiment of FIG. 8A). A first terminal of the storage capacitor Cst is electrically connected to the sensing node N1. A second terminal of the storage capacitor Cst may be electrically connected to a specific DC voltage (e.g. a ground voltage). A first terminal of the first sense transistor T1 is electrically connected to the sense data line SDL. A control terminal of the first sense transistor T1 receives a sense scan signal SE. A second terminal of the first sense transistor T1 is electrically connected to a first terminal of the second sense transistor T2. A second terminal of the second sense transistor T2 is electrically connected to a voltage V2. A control terminal of the second sense transistor T2 is electrically connected to the sensing node N1. A first terminal of the bias voltage source 1241 is electrically connected to a first input terminal of the operational amplifier 1242, and provides a voltage V3. A second terminal of the bias voltage source 1241 may be electrically connected to a specific DC voltage (e.g. a ground voltage). A second input terminal of the operational amplifier 1242 is electrically connected to the first terminal of the first sense transistor T1 through the sense data line SDL having the stray resistance R. A second input terminal of the operational amplifier 1242 is electrically connected to an output terminal of the operational amplifier 1242 through the capacitor 1243. An output terminal of the operational amplifier 1242 may be electrically connected to an external processing circuit.

In the embodiment of the disclosure, the reset transistor Tr, the first sense transistor T1 and the second sense transistor T2 may be an N-type transistor, respectively, such as an N-type metal oxide semiconductor (NMOS). The above-mentioned first terminal and the second terminal of the transistor may include a drain terminal and a source terminal, respectively, and the above-mentioned control terminal of the transistor may be a gate terminal. In addition, in the embodiment of the disclosure, the voltage V1 may be greater than the reset voltage Vrst, and the voltage V3 may be greater than the voltage V2.

In the embodiment of the disclosure, the second sense transistor T2 may be operated as a current driver. When a voltage of the sensing node N1 rises (during the above-mentioned test modes) and the first sense transistor T1 is turned-on by the sense scan signal SE having a high voltage level, a current of the first terminal of the first sense transistor T1 is correspondingly sink by the second sense transistor T2. Thus, a current corresponding to the voltage of the sensing node N1 is formed to flow from the second terminal of the operational amplifier 1242 to the first terminal of the first sense transistor T1 through the sense data line SDL. Then, an output voltage Vout output by the output terminal of the operational amplifier 1242 is correspondingly pulled up to keep a voltage of the second terminal of operational amplifier 1242 as same as a voltage of the first terminal of the operational amplifier 1242 through the capacitor 1243. Therefore, the external processing circuit may effectively receive a sensing result of the voltage of the sensing node N1 for calibration of the sensing circuit 1220 according to the output voltage Vout.

It should be noted that a normal mode (i.e. the sensing mode) and a calibration mode of electronic device 1200 may be implemented by analogy with the above-mentioned embodiments of FIG. 10 and FIG. 11, and thus will not be repeated here.

Figure 13:
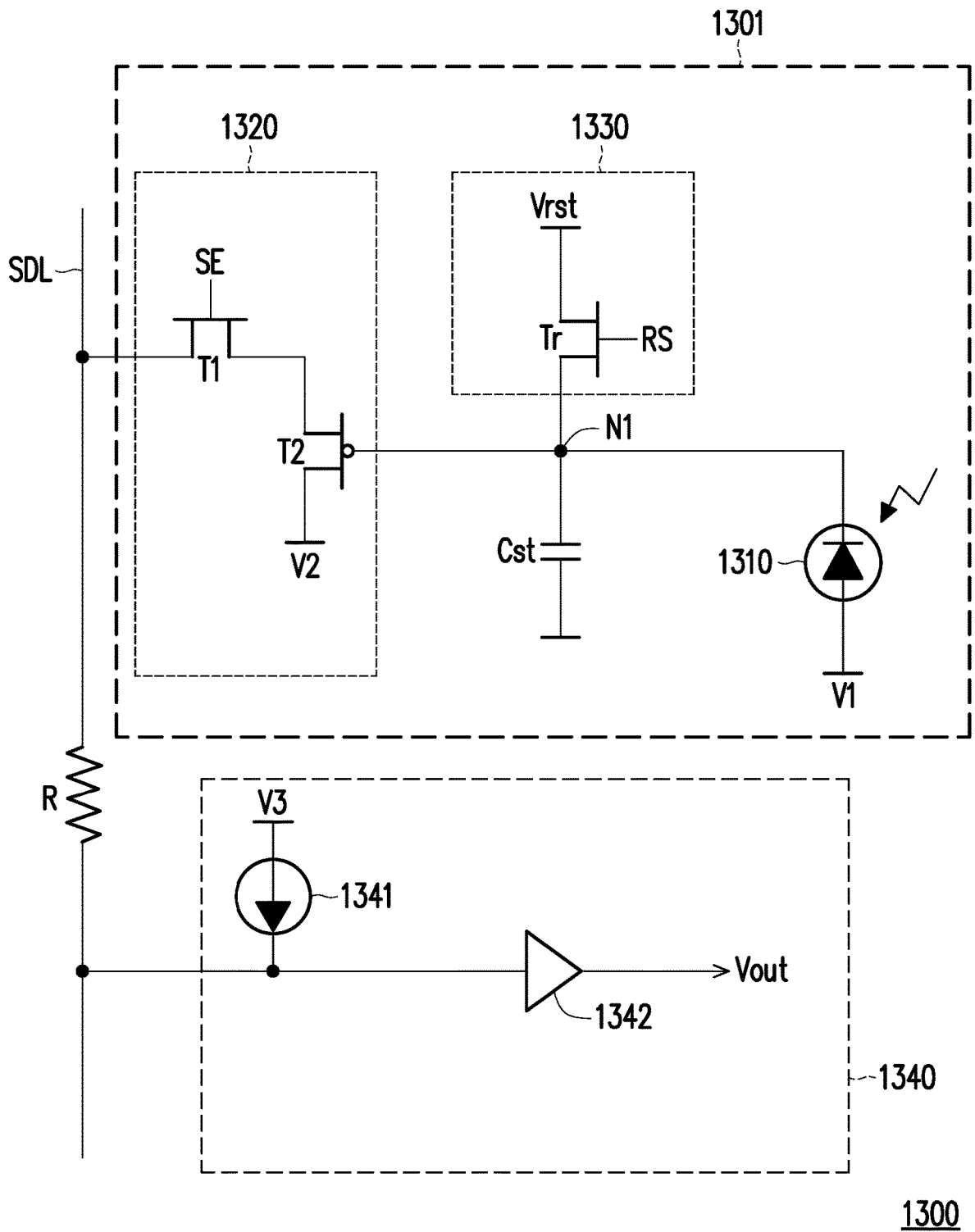
FIG. 13 is a schematic diagram of an electronic device according to an embodiment of the disclosure.

FIG. 13 is a schematic diagram of an electronic device according to an embodiment of the disclosure. Referring to FIG. 13, an electronic device 1300 includes an active matrix pixel array including a plurality of pixels, and a circuit architecture of at least one of the pixels may be the same as a pixel 1301. In the embodiment of the disclosure, the pixels of the electronic device 1300 may be configured to sense light, and the electronic device 1300 may be an active matrix sensor, such as a fingerprint sensor or an X-ray flat panel detector (FPD), but the disclosure is not limited thereto. In the embodiment of the disclosure, the electronic device 1300 includes the pixel 1301, a readout circuit 1340 and a sense data line SDL. There is a stray resistance R on the sense data line SDL. The pixel 1301 includes a storage capacitor Cst, an electronic unit 1310, a (voltage) sensing circuit 1320 and a reset circuit 1330. The readout circuit 1340 may be composed of a bias current source 1341 and a voltage amplifier 1342. The sensing circuit 1320 includes a first sense transistor T1 and a second sense transistor T2. The reset circuit 1330 includes a reset transistor Tr (may be used as the test transistor Tt of embodiment of FIG. 8A in a calibration mode). In the embodiment of the disclosure, the electronic unit 1310 may be a photodiode, but the disclosure is not limited thereto.

In the embodiment of the disclosure, a first terminal (cathode) of the electronic unit 1310 is electrically connected to a sensing node N1. A second terminal (anode) of the electronic unit 1310 is electrically connected to a voltage V1. A first terminal of the reset transistor Tr is electrically connected to a reset voltage Vrst (may be used as the test voltage Vtest of embodiment of FIG. 8A). A second terminal of the reset transistor Tr is electrically connected to the sensing node N1. A control terminal of the reset transistor Tr receives a reset signal (may be used as the test control signal of embodiment of FIG. 8A). A first terminal of the storage capacitor Cst is electrically connected to the sensing node N1. A second terminal of the storage capacitor Cst may be electrically connected to a specific DV voltage (e.g. a ground voltage). A first terminal of the first sense transistor T1 is electrically connected to the sense data line SDL. A control terminal of the first sense transistor T1 receives a sense scan signal SE. A second terminal of the second sense transistor T2 is electrically connected to a second terminal of the first sense transistor T1. A control terminal of the second sense transistor T2 is electrically connected to the sensing node N1. A first terminal of the second sense transistor T2 is electrically connected to a voltage V2. A first terminal of the bias current source 1341 is electrically connected to a voltage V3. A second terminal of the bias current source 1341 is electrically connected to the first terminal of the first sense transistor T1 through the sense data line SDL having the stray resistance R. An input terminal of the voltage amplifier 1342 is electrically connected to the first terminal of the first sense transistor T1 through the sense data line SDL having the stray resistance R. An output terminal of the voltage amplifier 1342 may be electrically connected to an external processing circuit.

In the embodiment of the disclosure, the reset transistor Tr and the first sense transistor T1 may be a N-type transistor, such as a N-type metal oxide semiconductor (NMOS), and the second sense transistor T2 may be a P-type transistor, such as a P-type metal oxide semiconductor (PMOS). The above-mentioned first terminal and the second terminal of the transistor may include a drain terminal and a source terminal, respectively, and the above-mentioned control terminal of the transistor may be a gate terminal. In addition, in the embodiment of the disclosure, the reset voltage Vrst may be greater than the voltage V1, and the voltage V3 may be greater than the voltage V2.

In the embodiment of the disclosure, the second sense transistor T2 may be operated as a source follower amplifier. When a voltage of the sensing node N1 drops (during the above-mentioned test modes) and the first sense transistor T1 is turned-on by the sense scan signal SE having a high voltage level, a voltage of the first terminal of the first sense transistor T1 is correspondingly pulled-down by the second sense transistor T2. Thus, a current corresponding to the voltage of the sensing node N1 is formed to flow from the bias current source 1341 to the first terminal of the first sense transistor T1 through the sense data line SDL. Then, the input terminal of the voltage amplifier 1342 may receive the dropped voltage of the first terminal of the first sense transistor T1, so that an output voltage Vout output by the output terminal of the voltage amplifier 1342 is correspondingly pulled-down. Therefore, the external processing circuit may effectively receive a sensing result of the voltage of the sensing node N1 for calibration of the sensing circuit 1320 according to the output voltage Vout.

It should be noted that a normal mode (i.e. the sensing mode) and a calibration mode of electronic device 1300 may be implemented by analogy with the above-mentioned embodiments of FIG. 10 and FIG. 11, and thus will not be repeated here.

Figure 14:
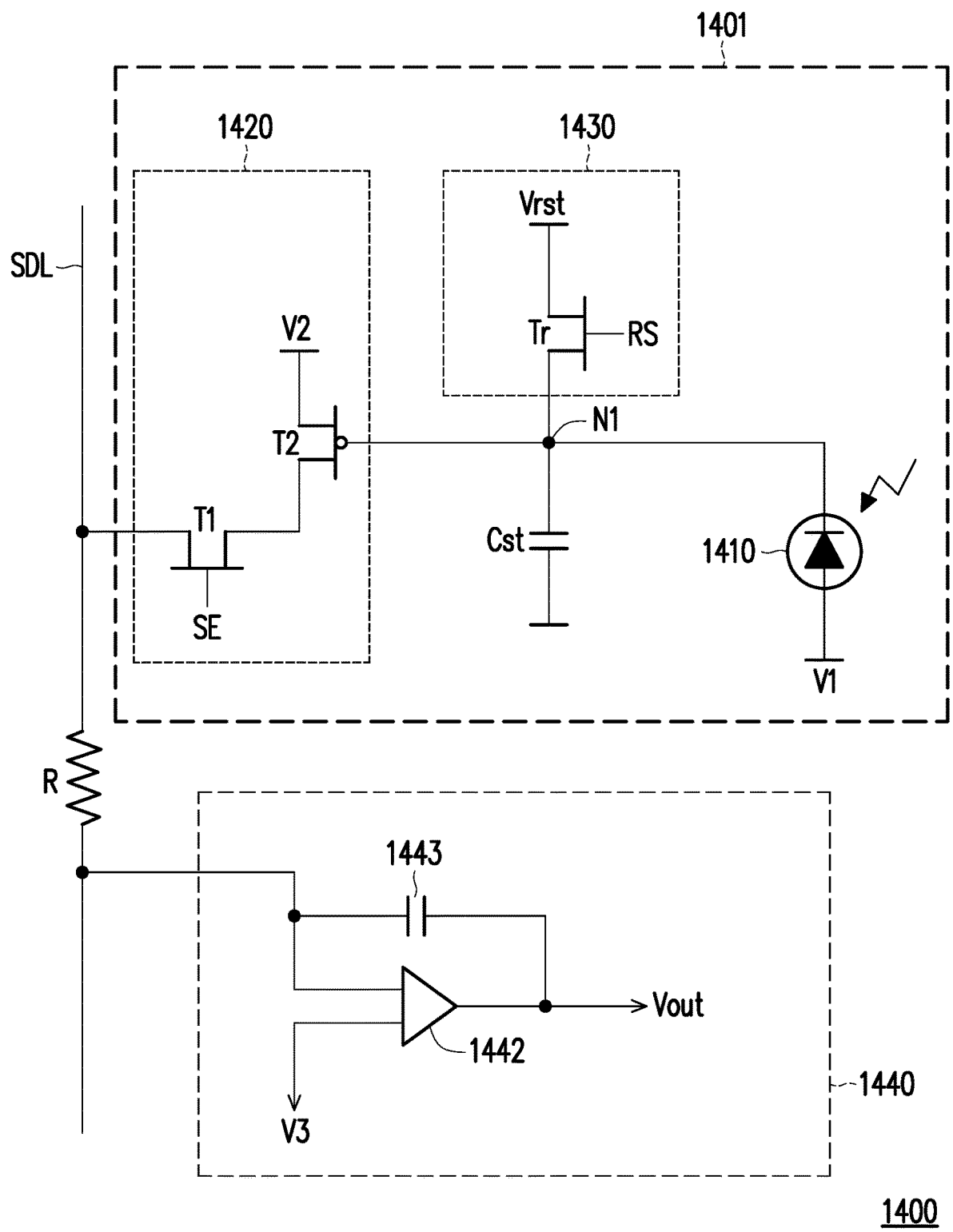
FIG. 14 is a schematic diagram of an electronic device according to an embodiment of the disclosure.

FIG. 14 is a schematic diagram of an electronic device according to an embodiment of the disclosure. Referring to FIG. 14, an electronic device 1400 includes an active matrix pixel array including a plurality of pixels, and a circuit architecture of at least one of the pixels may be the same as a pixel 1401. In the embodiment of the disclosure, the pixels of the electronic device 1400 may be configured to sense light, and the electronic device 1400 may be an active matrix sensor, such as a fingerprint sensor or an X-ray flat panel detector (FPD), but the disclosure is not limited thereto. In the embodiment of the disclosure, the electronic device 1400 includes the pixel 1401, a readout circuit 1440 and a sense data line SDL. There is a stray resistance R on the sense data line SDL. The pixel 1401 includes a storage capacitor Cst, an electronic unit 1410, a (voltage) sensing circuit 1420 and a reset circuit 1430. The readout circuit 1440 may be composed of an operational amplifier 1442 and a capacitor 1443 to form a charge integrator to convert current to voltage. The sensing circuit 1420 includes a first sense transistor T1 and a second sense transistor T2. The reset circuit 1430 includes a reset transistor Tr (may be used as the test transistor Tt of embodiment of FIG. 8A in a calibration mode). In the embodiment of the disclosure, the electronic unit 1410 may be a photodiode, but the disclosure is not limited thereto.

In the embodiment of the disclosure, a first terminal (cathode) of the electronic unit 1210 is electrically connected to a sensing node N1. A second terminal (anode) of the electronic unit 1210 is electrically connected to a voltage V1. A first terminal of the reset transistor Tr is electrically connected to a reset voltage Vrst (may be used as the test voltage Vtest of embodiment of FIG. 8A). A second terminal of the reset transistor Tr is electrically connected to the sensing node N1. A control terminal of the reset transistor Tr receives a reset signal (may be used as the test control signal of embodiment of FIG. 8A). A first terminal of the storage capacitor Cst is electrically connected to the sensing node N1. A second terminal of the storage capacitor Cst may be electrically connected to a specific DC voltage (e.g. a ground voltage). A first terminal of the first sense transistor T1 is electrically connected to the sense data line SDL. A control terminal of the first sense transistor T1 receives a sense scan signal SE. A second terminal of the second sense transistor T2 is electrically connected to a voltage V2. A first terminal of the second sense transistor T2 is electrically connected to a second terminal of the first sense transistor T2. A control terminal of the second sense transistor T2 is electrically connected to the sensing node N1. A first input terminal of the operational amplifier 1442 is electrically connected to a voltage V3. A second input terminal of the operational amplifier 1442 is electrically connected to the first terminal of the first sense transistor T1 through the sense data line SDL having the stray resistance R. A first terminal of the capacitor 1443 is electrically connected to an output terminal of the operational amplifier 1442. A second terminal of the capacitor 1443 is electrically connected to the second input terminal of the operational amplifier 1442. An output terminal of the operational amplifier 1442 may be electrically connected to an external processing circuit.

In the embodiment of the disclosure, the reset transistor Tr and the first sense transistor T1 may be an N-type transistor, respectively, such as an N-type metal oxide semiconductor (NMOS), and the second sense transistor T2 may be a P-type transistor, such as a P-type metal oxide semiconductor (PMOS). The above-mentioned first terminal and the second terminal of the transistor may include a drain terminal and a source terminal, respectively, and the above-mentioned control terminal of the transistor may be a gate terminal. In addition, in the embodiment of the disclosure, the reset voltage Vrst may be greater than the voltage V1, and the voltage V2 may be greater than the voltage V3.

In the embodiment of the disclosure, the second sense transistor T2 may be operated as a current driver. When a voltage of the sensing node N1 drops (during the above-mentioned test modes) and the first sense transistor T1 is turned-on by the sense scan signal SE having a high voltage level, a current flowing through the first terminal of the first sense transistor T1 is correspondingly sourced from the second sense transistor T2. Thus, a current corresponding to the voltage of the sensing node N1 is formed to flow from the first terminal of the first sense transistor T1 to the second input terminal of the operational amplifier 1442 through the sense data line SDL. Then, an output voltage Vout output by the output terminal of the operational amplifier 1442 is correspondingly pulled down to keep a voltage of the second terminal of operational amplifier as same as a voltage of the first terminal of the operational amplifier through the capacitor. Therefore, the external processing circuit may effectively receive a sensing result of the voltage of the sensing node N1 for calibration of the sensing circuit 1420 according to the output voltage Vout.

It should be noted that a normal mode (i.e. the sensing mode) and a calibration mode of electronic device 1400 may be implemented by analogy with the above-mentioned embodiments of FIG. 10 and FIG. 11, and thus will not be repeated here.

In summary, the electronic device of the disclosure can effectively calibrate the sensing circuit by means of the loop back calibration without any additional calibration instrument and calibration equipment.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
   an electronic unit;
   a sensing circuit, electrically connected to the electronic unit through a sensing node;
   a circuit, electrically connected to the sensing node, and configured to apply a voltage to the sensing node, wherein the circuit is a bias circuit; and
   a control data line, electrically connected to the bias circuit,
   wherein the circuit is configured to receive a control signal through the control data line according to a scan signal.

2. The electronic device according to claim 1, comprising: a scan transistor, electrically connected between the control data line and the circuit, and configured to receive the scan signal.

3. The electronic device according to claim 1, wherein the circuit comprises: a storage capacitor, electrically connected to the sensing node.

4. The electronic device according to claim 1, wherein the circuit comprises: a source follower amplifier, electrically connected to the sensing node.

5. The electronic device according to claim 1, wherein the electronic unit is a voltage controlled unit.

6. The electronic device according to claim 1, wherein the electronic unit is a sensing unit.

7. The electronic device according to claim 1, further comprising:
   a readout circuit, electrically connected to the sensing circuit through a sense data line.

8. The electronic device according to claim 7, wherein the sensing circuit comprises:
   a first sense transistor, electrically connected to the sense data line, and configured to readout a sense signal.

9. The electronic device according to claim 8, wherein the sensing circuit comprises:
   a second sense transistor, electrically connected between the sensing node and the first sense transistor,
   wherein the sensing circuit is a voltage mode sensing circuit.

10. The electronic device according to claim 8, wherein the sensing circuit comprises:
    a second sense transistor, electrically connected between the sensing node and the first sense transistor,
    wherein the sensing circuit is a current mode sensing circuit.

11. The electronic device according to claim 7, wherein the readout circuit is a voltage mode readout circuit.

12. The electronic device according to claim 7, wherein the readout circuit is a current mode readout circuit.

13. The electronic device according to claim 1, wherein the electronic device is configured to perform a calibration mode and a sensing mode.

14. The electronic device according to claim 13, wherein when the electronic device performs the calibration mode, the sensing circuit is configured to sense the sensing node with applying the voltage.

15. The electronic device according to claim 13, wherein when the electronic device performs the sensing mode, the sensing circuit is configured to sense the sensing node after the voltage is applied to the sensing node.

16. An electronic device, comprising:
    an electronic unit;
    a sensing circuit, electrically connected to the electronic unit through a sensing node;
    a circuit, electrically connected to the sensing node, and configured to apply a voltage to the sensing node, wherein the circuit is a reset circuit; and
    a readout circuit, electrically connected to the sensing circuit through a sense data line,
    wherein the sensing circuit comprises:
        a first sense transistor, electrically connected to the sense data line, and configured to readout a sense signal; and
        a second sense transistor, electrically connected between the sensing node and the first sense transistor,
    wherein the sensing circuit is a current mode sensing circuit.

17. The electronic device according to claim 16, wherein the circuit is electrically connected to a common voltage source, and configured to receive a reset signal.

18. The electronic device according to claim 17, wherein the circuit comprises:
    a reset transistor, electrically connected to the sensing node, and configured to receive the reset signal.

* * * * *